United States Patent
Staszewski et al.

(10) Patent No.: US 7,623,838 B2
(45) Date of Patent: Nov. 24, 2009

(54) SAMPLING MIXER WITH ASYNCHRONOUS CLOCK AND SIGNAL DOMAINS

(75) Inventors: Robert Staszewski, Delft (NL); Khurram Muhammad, Dallas, TX (US); Yo-Chuol Ho, Allen, TX (US); Dirk Leipold, Obserschan (CH)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/028,995

(22) Filed: Jan. 3, 2005

(65) Prior Publication Data

US 2005/0130618 A1  Jun. 16, 2005

Related U.S. Application Data

(62) Division of application No. 10/121,761, filed on Apr. 12, 2002.

(60) Provisional application No. 60/348,902, filed on Oct. 26, 2001.

(51) Int. Cl.
  *H04B 1/26* (2006.01)
(52) U.S. Cl. .................. 455/319; 455/324
(58) Field of Classification Search ............. 455/313, 455/318, 319, 323, 324, 326, 333, 334; 327/113; 375/346, 350
See application file for complete search history.

(56) References Cited

U.S. PATENT DOCUMENTS

| | | | | |
|---|---|---|---|---|
| 6,064,871 | A * | 5/2000 | Leung | 455/323 |
| 6,181,740 | B1 * | 1/2001 | Yasuda | 375/232 |
| 6,438,366 | B1 * | 8/2002 | Lindfors et al. | 455/334 |
| 6,829,311 | B1 * | 12/2004 | Riley | 375/326 |
| 6,856,925 | B2 * | 2/2005 | Muhammad et al. | 702/75 |
| 6,963,732 | B2 * | 11/2005 | Muhammad et al. | 455/131 |
| 7,006,813 | B2 * | 2/2006 | Staszewski et al. | 455/323 |
| 2003/0035499 | A1 * | 2/2003 | Staszewski et al. | 375/346 |
| 2003/0050027 | A1 * | 3/2003 | Muhammad et al. | 455/257 |
| 2005/0025268 | A1 * | 2/2005 | Muhammad et al. | 375/346 |

* cited by examiner

*Primary Examiner*—Nguyen Vo
(74) *Attorney, Agent, or Firm*—Ronald O. Neerings; Wade James Brady, III; Frederick J. Telecky, Jr.

(57) ABSTRACT

A mixer 1100 with a plurality of signal paths typically requires separate clock generating hardware for each signal path. However, the redundancy of having multiple clock generating hardware significantly increases power consumption and integrated circuit area when the mixer 1100 is integrated into silicon. A method and apparatus 1125 containing a circuit for generating a set of clock signals that can be shared by the different signal paths is presented. Advantage is taken of the significant capacitance difference between different sampling capacitors in the mixer and the superposition property.

30 Claims, 11 Drawing Sheets

27
SAMPLING MIXER WITH ASYNCHRONOUS CLOCK AND SIGNAL DOMAINS

This application is a divisional of application Ser. No. 10/121,761, filed Apr. 12, 2002, which claims priority to application Ser. No. 60/348,902, filed Oct. 26, 2001.

FIELD OF THE INVENTION

This invention relates generally to wireless communications systems, and particularly to simplifying the clock generation hardware to reduce power consumption and hardware usage.

BACKGROUND OF THE INVENTION

Discrete-time radio frequency (RF) is a newly emerging field in wireless digital communications wherein analog RF signals that are transmitted over-the-air are directly sampled into a discrete-time sample stream suitable for digital signal processing. A typical wireless digital communications device would use analog filters, duplexers, mixers, analog-to-digital converters (ADC), etc. to convert the analog RF signals into a digital data stream that is suitable for digital signal processing. Unfortunately, analog circuit components, especially components such as capacitors, inductors, resistors, etc. necessary for the analog filters are difficult to integrate into an integrated circuit. This is especially true for the precise values of these components required for use in filters. Of course, it is the desire of the manufacturer to maximize the degree of integration for the wireless transceivers. This is because the more highly integrated a wireless transceiver can become, the lower the production costs for the transceiver and the transceiver will typically use less power during operation.

Discrete-time RF involves the direct conversion of the analog RF signal into a discrete-time sample stream through the use of a direct sampling mixer, without having to undergo any intermediate analog filtering, downconversion, etc. An example of a direct sampling mixer is one that uses current to perform its sampling. The current-mode discrete-time sampling mixer converts the received analog RF signal into a current that is then integrated by a sampling capacitor. The charge on the sampling capacitor is then periodically read to produce samples for the discrete-time sample stream.

Many mixers work with more than one signal stream, i.e., the RF current is periodically integrated at various points in time to produce multiple sample streams. For example, it is fairly typical for a digital transceiver to process the received signal stream as two separate streams, an in-phase (I) stream and a quadrature-phase (Q) stream. Additionally, many use differential signaling, wherein a portion of each signal is received along with a portion of the same signal that is 180 degrees out of phase. Therefore, the mixers can be quite complex, with four separate signal paths.

A significant disadvantage of having four separate signal paths in the mixer stems from the fact that each signal path requires a different clock. For example, the clock for a positive I stream will differ from the clock for a positive Q stream by 90 degrees and the clock for a positive stream will differ from the clock for a negative stream by 180 degrees. Since the clocks typically differ from one another by a phase angle, it is common for each signal path will have its own clock generation hardware.

One possible solution to providing separate clocks to each signal path is to provide each signal path with its own local oscillator (LO) generating a signal of desired period with the proper timing and then a series of clock dividers to generate clocks of the proper frequency from the signal generated by the LO. However, the use of a different LO for each signal path can result in synchronization problems due to frequency differences in the signals generated by the different LOs, resulting in a degraded downconverted signal. Alternatively, there may be a single LO, whose signal is fed to each of the signal paths and each signal path has its own clock generating hardware that would take the signal from the LO and derive the necessary clock signals. Regardless of whether a single LO or multiple LOs are used, there is typically a separate set of clock generating hardware for each signal path.

A major disadvantage in having separate clock generating hardware for each signal path is power consumption. As expected, the clock generating hardware must also be clocked at high frequencies and hardware clocked at high frequencies consumes more power than hardware clocked at low frequencies. Also for more complex clocking schemes, a large amount of hardware is required for the clock generating hardware. The clocking at high operating frequencies and the redundancy of the generating hardware results in a significant amount of power consumption. For example, in a mixer with four signal paths, four complete sets of clock generating hardware are required. An additional disadvantage is that the redundant clock generating hardware also requires a lot of real estate when it comes time to integrate the mixer hardware into an integrated circuit. The increased real estate results in a larger, more expensive device.

A need has therefore arisen for a way to generate clock signals required in a mixer with multiple signal paths without needing to replicate the clock generating hardware for each signal path.

SUMMARY OF THE INVENTION

In one aspect, the present invention provides a method for generating clock signals for use in activating and deactivating rotating capacitors in a receiver mixer with a plurality of signal paths to sample a received data signal, the method comprising the steps of producing a reference signal, generating a set of clock signals from the reference signal, and distributing the set of clock signals to the plurality of signal paths, wherein the set of clock signals are used to activate and deactivate rotating capacitors in each of the signal paths.

In another aspect, the present invention provides a circuit for generating a set of clock signals for use in activating rotating capacitors in a radio transceiver with a plurality of signal paths, the circuit comprising a reference signal generator to generate a clock signal at a specified frequency, a clock divider coupled to the reference signal generator, the divider containing circuitry to divide the clock signal to change the frequency of the clock signal, and a clock generator coupled to the clock divider, the clock generator containing circuitry to output the set of clock signals to the plurality of signal paths.

In yet another aspect, the present invention provides a radio receiver comprising a radio frequency (RF) input to receive RF signals, a current-mode sampling mixer coupled to the RF input, the mixer comprising a plurality of signal paths, each signal path coupled to the RF input and a local oscillator, the signal path containing circuitry to sample a received signal provided by the RF input and to output a discrete-time sample stream, a timing circuit coupled to the plurality of signal paths, the timing circuit containing circuitry to control the operation of the signal paths, and the radio receiver further comprising a signal processing circuit coupled to the mixer, the signal processing circuit containing circuitry to transform output produced by the plurality of signal paths into user usable data.

In another aspect, the present invention provides a wireless communications device comprising an antenna to receive and transmit radio frequency (RF) signals, a RF receiver coupled to the antenna, the RF receiver containing circuitry to convert RF signals into a data stream, the RF receiver comprising a current-mode sampling mixer, the current-mode sampling mixer comprising a plurality of signal paths, each signal path coupled to the antenna and a local oscillator, the signal path containing circuitry to sample a received signal provided by the antenna and produce a discrete-time sample stream of the received signal, a timing circuit coupled to the plurality of signal paths, the timing circuit containing circuitry to control the operation of the signal paths, the wireless communications device further comprising a digital baseband (DBB) controller coupled to the RF transceiver, the DBB controller containing circuitry to digitally process the data stream provided by the RF transceiver and convert it into user usable data, and a memory coupled to the DBB controller, the memory containing storage elements to store data and programs.

The present invention provides a number of advantages. For example, use of a preferred embodiment of the present invention allows the use of a single clock signal generated by one local oscillator in the generation of multiple clock signals, each with a different phase angle, rather than using different clock signals generated by the local oscillator in conjunction with separate clock generating hardware for each different lower frequency clock signal with a different phase angle. This results in a significant reduction in the amount of clock generating hardware, leading to a reduction in the overall size of the integrated wireless transceiver.

Also, use of a preferred embodiment of the present invention reduces power consumption of the overall wireless transceiver by reducing the clock generating hardware. The reduction in the power consumption increases battery life (or reduces the size of a power supply) and decreases heat dissipation concerns.

Additionally, use of a preferred embodiment of the present invention reduces the overall amount of hardware that needs to be integrated into an integrated circuit. By reducing the hardware requirements, it is possible to create a smaller radio transceiver. A smaller radio transceiver leads to a smaller, less expensive product.

BRIEF DESCRIPTION OF THE DRAWINGS

The above features of the present invention will be more clearly understood from consideration of the following descriptions in connection with accompanying drawings in which:

FIG. 13 illustrates the phase angle differences between rotating capacitor-activating signals in the various signal paths of the current-mode sampling mixer of FIG. 6a;

DETAILED DESCRIPTION OF ILLUSTRATIVE EMBODIMENTS

The making and use of the various embodiments are discussed below in detail. However, it should be appreciated that the present invention provides many applicable inventive concepts, which can be embodied in a wide variety of specific contexts. The specific embodiments discussed are merely illustrative of specific ways to make and use the invention, and do not limit the scope of the invention.

The following discussion focuses on a particular type of radio receiver mixer and its circuitry that is operating in a 2.4 Gigahertz frequency band and is adherent to the Bluetooth technical standards. The Bluetooth technical standard specifies a short-range wireless communications network whose intended purpose is a low-power and low-cost replacement for physical cabling. The Bluetooth technical standard is specified in a document entitled "Specification of the Bluetooth System, Version 1.1, Feb. 22, 2001," which is incorporated herein by reference. While the discussion focuses on Bluetooth radios, the present invention is operable in other frequency bands and other technical standards, therefore, the discussion should not be construed as limiting the present invention to Bluetooth transceivers operating at 2.4 Gigahertz. For example, the present invention has application in global positioning systems (GPS), low-earth orbit satellite system based communications systems and cellular based communications systems. The cellular based systems may include first, second, and third generation (and beyond) digital phone systems, time-division multiple access (TDMA), code-division multiple access (CDMA), global system for mobile communications (GSM) technology along with other digital communications technologies operating at various carrier frequencies. Additionally, the receiver mixer of the present invention has application in wired receivers as well.

Figure 1A:
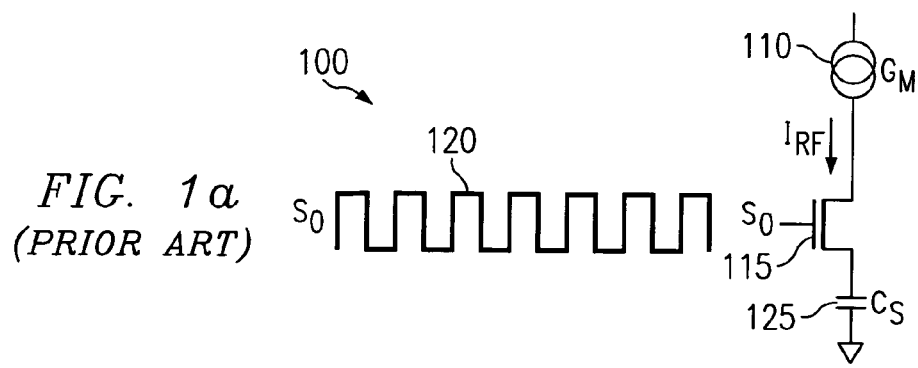
FIGS. 1a and 1b illustrate prior art embodiments of current-mode sampling mixers.

Referring now to FIG. 1a, a block diagram illustrates a prior art embodiment of a current-mode direct sampling mixer 100. The mixer 100 includes an amplifier 110 (sometimes referred to as a low-noise transconductance amplifier (LNTA)), an RF switch 115 driven by a signal 120 generated by a local oscillator (not shown), and a sampling capacitor (Cs) 125. An alternative version of the mixer 100 exists wherein an antenna (not shown) is coupled to the amplifier, the antenna is used to receive analog RF signals transmitted over-the-air. The direct electrical coupling provides a direct signal path from the antenna into the mixer 100.

An analog RF signal that is provided to the mixer 100 (the analog RF signal may be provided to the mixer 100 via a direct wire or cable connection or transmitted over-the-air) in the form of an RF voltage that is then converted into an RF current by the LNTA 110, which has a transconductance gain of $g_m$. The flow of the RF current is switched by the RF switch 115, which is driven by the signal 120 generated by a local oscillator (LO). The frequency of the signal 120 is referred to as a sampling frequency and is commonly denoted $f_s$. The sampling frequency is normally approximately equal to the frequency used to create the analog RF signal.

As displayed in FIG. 1a, when the signal 120 is high, the RF switch 115 is closed, creating a path for the RF current. The RF current is integrated by the sampling capacitor 125, increasing (or decreasing) the charge on the sampling capacitor 125, depending on the direction of the current flow. In order to fully sample the analog RF signal, an identical current-mode sampling mixer with an RF switch that is driven by an inverse (or complement) of the signal generated by the LO is used. The identical current-mode sampling mixer is used to sample the analog RF signal when the current-mode sampling mixer 100 is decoupled from the LNTA 110 by the RF switch 115 when the signal 120 is low.

Figure 1B:
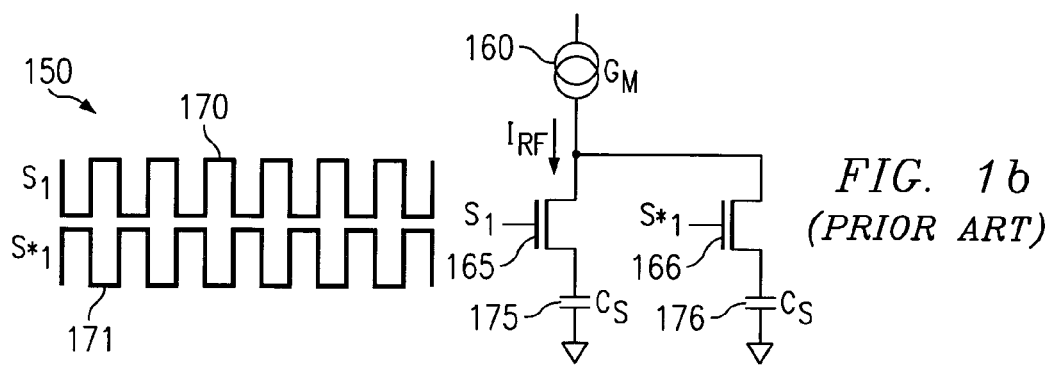

Referring now to FIG. 1b, a diagram illustrates a prior art embodiment of a current-mode direct sampling mixer 150 used to fully sample the analog RF signal. The mixer 150 is similar to the mixer 100 displayed in FIG. 1a with the addition of an extra RF switch and sampling capacitor. A first RF switch 165 is controlled by a signal 170, which is the same as the signal 120 in the mixer 100 displayed in FIG. 1a. However, a second RF switch 166 is controlled by a second signal 171 that may be thought of as an inverse (or complement) of the signal 170. The two signals 170 and 171 are operating on opposite half-cycles of one another. When one RF switch is on, the other RF switch is off. This configuration allows the mixer 150 to integrate the RF current at all times. The mixer 150, as illustrated in FIG. 1b, is operating in what is known as a pseudo-differential configuration.

Referring back to FIG. 1a, the charge that is integrated on the sampling capacitor 125 is periodically read out to produce a single sampled data value. The frequency of the charge read out can vary from being equal to the frequency of the signal 120 to some integer divisor of the frequency of the signal 120. The periodic reading out of the charge on the sampling capacitor 125 produces a discrete-time sample stream of the analog RF signal.

Unfortunately, when the charge on the sampling capacitor 125 is being read out, the sampling capacitor 125 cannot be used to integrate the RF current, or vice versa. Therefore, the current-mode sampling mixer 100 as displayed in FIG. 1a does not permit the reading of the charge accumulated on its sampling capacitor 125 while the signal 120 is actively switching. Also, the amount of time required to read the charge from the sampling capacitor 125 is typically longer than the amount of time to integrate the RF current, i.e., half of the period of the signal 120. Therefore, it is normally not feasible to attempt a charge read out while the signal 120 is inactive.

Notice that the switches, both RF and non-RF switches, displayed in the figures and discussed in this specifications are displayed as n-type metal oxide semiconductor (NMOS) transistor switches. However, these switches may be made out p-type metal oxide semiconductor (PMOS) or complementary metal oxide semiconductor (CMOS) transistor pass gates as well without loss in performance or generality. Of course, the use of other types of switches may require minor rearrangements of the mixers. For example, the use of PMOS switches would require that the coupling be tied to Vdd (the substrate power source) rather than the substrate ground as the figures in this specifications display. However, the rearrangements are minor and are well understood by those of ordinary skill in the art of the present invention.

Figure 2:
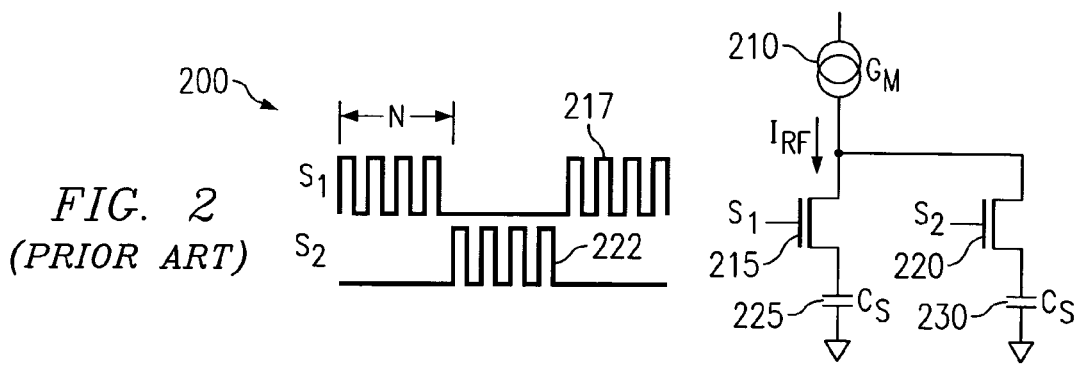
FIG. 2 illustrates a prior art embodiment of a current-mode sampling mixer with cyclic charge read out.

Referring now to FIG. 2, a block diagram illustrates a prior art embodiment of the current-mode sampling mixer 200 with cyclic charge read out. The mixer 200 is essentially the same as the mixer 150 of FIG. 1b. When more than one sampling capacitor is used, the current-mode sampling mixer is sometimes referred to as a multi-tap direct sampling mixer (MTDSM). A second RF switch 220 and sampling capacitor 230 pair allows the task of integrating the RF current to be shared between two sampling capacitors 225 and 230. The RF switches, S1 215 and S2 220, are driven by signals 217 (for switch S1) and 222 (for switch S2). The signals 217 and 222 may be thought of as portions of the signal generated by the LO. For example, the signal 217 may be configured to gate the signal produced by the LO for N cycles and then remain low for the next N cycles and return to gating the LO signal for the next N cycles. The number N is equal to the number of RF cycles the sampling capacitors will integrate the RF current. When the two signals 217 and 222 are combined, the result is the original signal produced by the LO.

When one signal (217 or 222) is gating the signal produced by the LO, the RF switch (215 or 220, respectively) that is controlled by the signal alternates between being closed and open, permitting the RF current to flow to the respective sampling capacitor. When one signal (217 or 222) is gating the signal produced by the LO, the other signal (222 or 217) is low, and the switch associated with the signal is open, not permitting any RF current to reach the sampling capacitor. While one sampling capacitor is busy integrating the RF current, the second sampling capacitor is not integrating the RF current and therefore its charge can be read out. The roles are then reversed to allow the reading of the charge integrated by the first sampling capacitor to be read out. If the capacitance of each of the sampling capacitors is $C_S$, then at any given time, the capacitance seen by the RF current remains $C_S$ because the RF current only sees one sampling capacitor at a time (due to the nature of the signals 217 and 222).

This periodic integration of a number of half-rectified RF samples performs a finite-impulse response (FIR) filtering operation and is sometimes referred to as a temporal moving average (MA). For example, if the number of half-rectified RF samples being integrated in each period is N, then the operation is referred to as a moving average N, or MA-N. The MA-N operation corresponds to an FIR filtering operation with N coefficients, with all coefficients being unity. The FIR filtering operation can be expressed in equation form as:

$$w_i = \sum_{l=0}^{N-1} u_{i-l}$$

Where: $u_i$ is the i-th RF sample and $w_i$ is the accumulated charge on the sampling capacitor. Due to the fact that the MA-N operation is being read out at the lower rate of once per N RF cycles, aliasing occurs with a foldover frequency at $f_0/2N$. FIR filtering and MA-N operations are considered well understood by those of ordinary skill in the art of the present invention and will not be discussed in detail in these specifications.

The current-mode sampling mixer can be further modified to perform an infinite-impulse response (IIR) filtering operation. IIR filtering operations are usually considered to be stronger filtering operations than FIR filtering operations. Therefore, IIR filtering operations are generally more preferred. IIR filtering operations are considered well understood by those of ordinary skill in the art of the present invention and will not be discussed in detail in these specifications.

Figure 3:
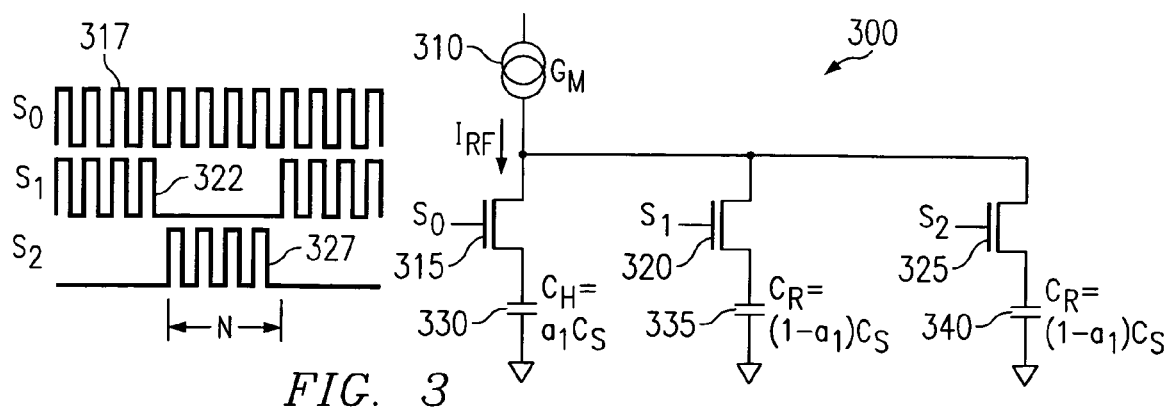
FIG. 3 illustrates a current-mode sampling mixer with recursive operation to provide infinite-impulse response filtering according to a preferred embodiment of the present invention.

Referring now to FIG. 3, a block diagram illustrates a current-mode sampling mixer 300 with recursive operation to provide IIR filtering according to a preferred embodiment of the present invention. According to a preferred embodiment of the present invention, the current-mode sampling mixer 300 uses two different types (in terms of capacitive value) of sampling capacitors. A first type of sampling capacitor is referred to as a history capacitor, denoted $C_H$, and is used to store the "history" of the RF current. According to a preferred embodiment of the present invention, the history capacitor always integrates the RF current, meaning that with exception of the negative half-cycle, the history capacitor continually integrates the RF current. A second type of sampling capacitor is referred to as a rotating capacitor, denoted $C_R$, and is used to periodically integrate the RF current in a manner similar to the sampling capacitors discussed in FIG. 2. Unlike the mixer 200 in FIG. 2, wherein the actual capacitive value of the sampling capacitors was not crucial as long as the sampling capacitors all had the same values, the values of the history and rotating capacitors in the mixer 300 is important. In actuality, the capacitive value of the sampling capacitors in FIG. 2 is used for determining the gain of the sampling operation, but is not vital to the proper operation of the mixer 200.

According to a preferred embodiment of the present invention, the value of the history capacitor is $a_1 * C_S$, where $C_S$ is the value of the sampling capacitor used in the mixer of FIG. 2 and $a_1$ is a constant. Given that the history capacitor has a specified value of $a_1 * C_S$, then it is preferred (for reasons that will be discussed below) that each of the rotating capacitors have a value of $(1-a_1) * C_S$. It is preferred that the ratio of $C_H$ to $C_R$ be approximately 30, although ratios greater than 30 also result in efficiently operating mixers. As an example, a preferred value for $a_1$ may be 0.9686. Therefore $C_H$ is approximately thirty one (31) times the value of each one of the $C_R$ capacitors, $C_H/C_R \cong 31$.

The mixer 300, as displayed in FIG. 3, has three RF switches 315, 320, and 325. The RF switches are driven by signals 317, 322, and 327 respectively. The signal 317 is the signal generated by the LO while signals 322 and 327 are gated versions of signal 317, similar to signals 217 and 222 from FIG. 2. Therefore, at any given instance in time, the RF current is being integrated by the history capacitor ($C_H$) and one of the two rotating capacitors ($C_R$). Since the capacitance of the history capacitor is $a_1 * C_S$ and that of the rotating capacitor is $(1-a_1) * C_S$, then the RF current sees an overall capacitance of $a_1 * C_S + (1-a_1) * C_S = C_S$. This is the same capacitance seen by the RF current in the mixer 200 displayed in FIG. 2.

Assuming that each rotating capacitor is active for N cycles, the IIR filtering is arrived at in the following manner: the RF current is integrated over N RF cycles, with the charge being shared on both the history and the active rotating capacitor. The amount of charge on the respective capacitors is proportional to their capacitance. At the end of an N cycle accumulation period, the active rotating capacitor stores $(1-a_1)$ of the total charge, stops further integration, and prepares for reading out its charge. The formerly inactive rotating capacitor joins the history capacitor in the integration process and at the same time obtains $(1-a_1)$ of the charge stored on the $C_H$ capacitor (assuming that the formerly inactive rotating capacitor had no initial charge). If the input charge integrated over the most recent N cycles is $w_j$, then the charge $s_j$ stored in the system at sampling time j can be described as a single-pole recursive IIR equation:

$$s_j = a_1 * s_{j-1} + w_j$$

and the output charge $x_j$ is $(1-a_1)$ times the system charge of the most recent cycle. This is a discrete-time IIR filter operating at $f_0/N$ sampling rate and possesses a single pole, where $f_0$ is the frequency of the signal generated by the LO.

When operating at high frequencies, for example, if the wireless transceiver is designed for use as Bluetooth transceiver, the operating frequency ($f_0$) is 2.4 Gigahertz and if N=8, then the read out frequency is $f_0/N$ or 300 MHz. Although significantly smaller than 2.4 GHz, 300 MHz remains a very high frequency when it comes to reading out the charge on the rotating capacitors, therefore, it is desired to relax the read out time even more. In addition to increasing the value of N, one way that the period of the read out time may be further increased is by adding additional rotating capacitors, $C_R$, and then reading the charge stored on one of the rotating capacitors while the remaining capacitors continue integrating the RF current.

Figure 4A:
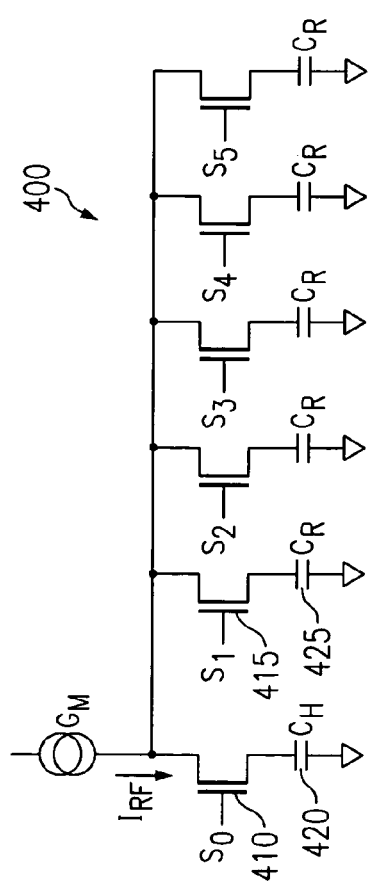
FIGS. 4a and 4b illustrate the use and timing of rotating capacitors in a current-mode sampling mixer to increase (relax) the charge read out time according to a preferred embodiment of the present invention.

Referring now to FIG. 4a, a block diagram illustrates the use of five rotating capacitors in a current-mode sampling mixer 400 to increase the charge read out time according to a preferred embodiment of the present invention. The mixer 400 is identical to the mixer displayed in FIG. 3, with the exception of three additional rotating capacitors and RF switches. The mixer 400 has a redundancy of 4 (the total number of rotating capacitors minus one (5−1=4)). The RF switches for the rotating capacitors (RF switches S1, S2, S3, S4, and S5) are driven by signals designed so that only one of the RF switches is active at a given time. An RF switch 410, S0, controls the history capacitor and is driven by a signal generated by the LO, making it active at all times.

One of the five rotating capacitors is chosen to have its charge read out. The charge read out cycle may be as long in duration as the integration time of the four remaining rotating capacitors, hence providing a larger amount of time (when compared to the integration time of a single rotating capacitor) to extract the charge stored on the selected rotating capacitor.

Figure 4B:
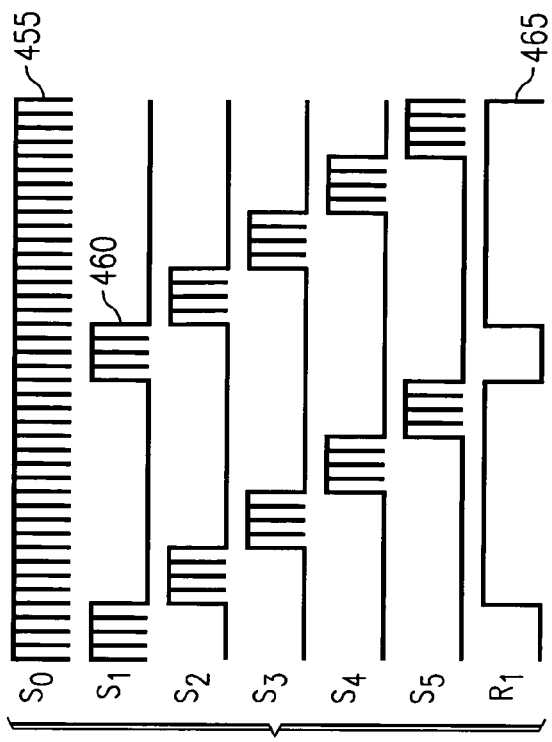

Referring now to FIG. 4b, a timing diagram illustrates the signals driving the various RF switches in the mixer 400 and a charge read out cycle according to a preferred embodiment of the present invention. A first timing trace 455 displays the signal generated by the LO, used to drive the RF switch, S0 (410 from FIG. 4a), while a second timing trace 460 displays the signal used to drive the RF switch, S1 (415 from FIG. 4a). Similar traces display the signals driving the remaining RF switches. A timing trace 465 represent the charge read out cycle. According to a preferred embodiment of the present invention, when the timing trace 465 is high, the charge read out cycle is active and the charge collected on the selected rotating capacitor is being read out. As displayed in FIG. 4b, the selected rotating capacitor is the capacitor associated with the RF switch, S1 (415 in FIG. 4a). Notice that the charge read out cycle (trace 465) is inactive when the RF switch S1 is active, permitting the rotating capacitor to integrate the RF current.

According to a preferred embodiment of the present invention, the charge collected on the rotating capacitors that are not selected for charge read out is discarded by short-circuiting them (to electrical ground) when they are not in use. The discarding of the charge on the unselected rotating capacitors results in what is known as decimation, a reduction in the total number of samples used to represent a signal. In the example displayed in FIG. 4a, there are five rotating capacitors and only one rotating capacitor is read out, therefore, the decimation is equal to five since only one out of every five samples is used and the remaining four samples are discarded. Decimation is known to cause aliasing and compensation for the aliasing must be provided. Aliasing is a phenomenon that occurs when frequency components of a signal that are located at frequencies greater than the sampling frequency are wrapped around and added to frequency components that are less than the sampling frequency. Aliasing is considered well understood by those of ordinary skill in the art of the present invention and will not be discussed in detail in these specifications.

Additional banks of rotating capacitors can be added to the mixer as an alternative to simply adding rotating capacitors to reduce timing constraints on the charge read out. By simply adding rotating capacitors to an existing current-mode sampling mixer, as displayed in FIG. 4a, the samples are decimated by an increasingly larger amount. When there are M rotating capacitors and there are no capacitor banks, the decimation of the discrete-time sample stream is equal to M. The greater the decimation of the sample stream, the greater the amount of aliasing that occurs. Therefore, it is preferred to minimize undesired decimation of the sample stream.

Figure 5A:
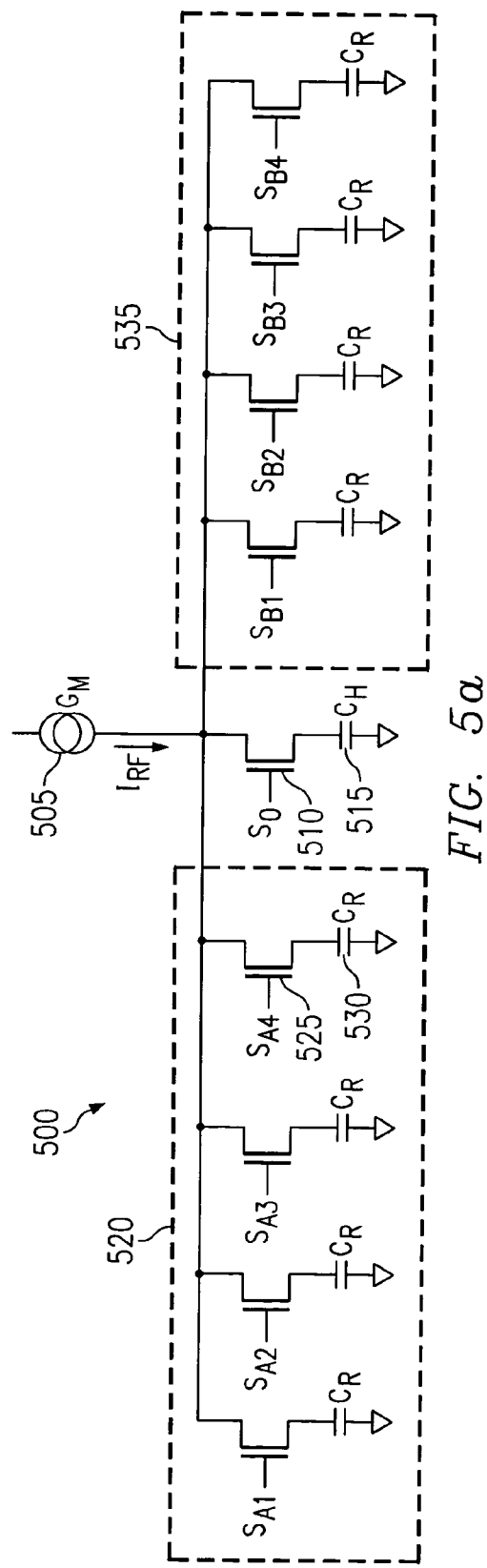
FIGS. 5a and 5b illustrate the use and timing of two banks of rotating capacitors in a current-mode sampling mixer to simultaneously reduce the aliasing of the discrete-time sample stream and relax the charge read out time according to a preferred embodiment of the present invention.

Referring now to FIG. 5a, a block diagram illustrates a current-mode sampling mixer 500 utilizing two banks of rotating capacitors 520 and 535 to simultaneously reduce the aliasing of the discrete-time sample stream and relax the charge read out time according to a preferred embodiment of the present invention. The mixer 500 has an RF switch 510, S0, and a history capacitor 515 like the mixer displayed in FIG. 4a. According to a preferred embodiment of the present invention, at any given time, one of the rotating capacitor banks 520 or 535 is integrating the RF current with one of its rotating capacitors, for example, rotating capacitor 530, while the remaining rotating capacitors are waiting their turn at integrating the RF current. While one rotating capacitor bank is busy integrating the RF current, the other rotating capacitor bank is having the charge on its rotating capacitors simultaneously read out.

Figure 5B:
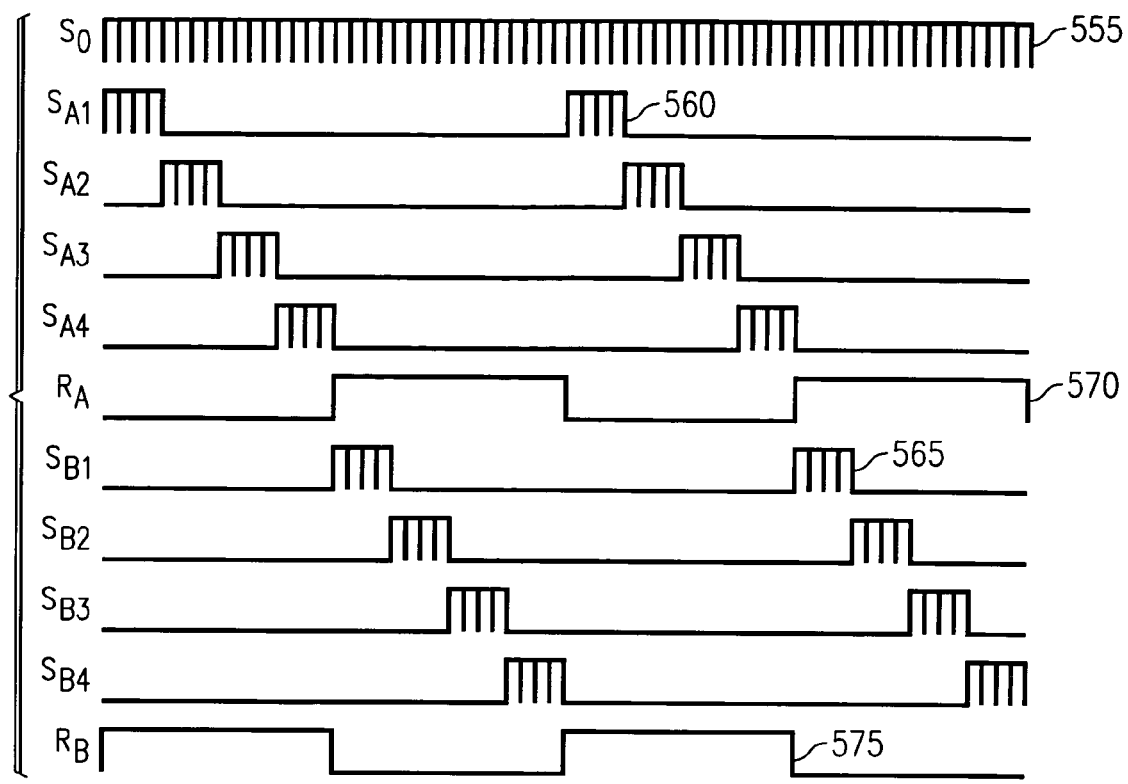

Referring now to FIG. 5b, a timing diagram illustrates the signals driving the various RF switches in the mixer 500 and a charge read out cycle for each of the two rotating capacitor banks according to a preferred embodiment of the present invention. A first timing curve 555 displays the signal output of the LO that is used to drive the RF switch S1. A second timing curve 560 displays the signal used to drive the RF switch SA1 of the rotating capacitor bank 520 while another timing curve 565 displays the signal used to drive the RF switch SB1 of the rotating capacitor bank 535. Other timing curves display the signals used to drive other RF switches in the mixer 500. A timing curve 570 displays the total charge read out cycle for rotating capacitor bank 520 and another timing curve 575 displays the total charge read out cycle for rotating capacitor bank 535.

Taking a closer examination of the timing curve 570, displaying the total charge read out cycle for rotating capacitor bank 520, it is readily evident that the charge read out cycle is active (signified by a high value) only when the rotating capacitors themselves are not integrating the RF current. This permits the charge on all of the rotating capacitors to be read out. According to a preferred embodiment of the present invention, the charge on each of the rotating capacitors within a single rotating capacitor bank is read out by combining the individual charges together (short circuiting the rotating capacitors together) and then reading the combined charge. This results in an FIR filtering operation with a moving average of length equal to the number of rotating capacitors in the rotating capacitor bank. As displayed in FIG. 5a, the moving average is four (MA-4). Once the charge stored on the rotating capacitors are read out, the rotating capacitors are reset. Following the reset operation, the rotating capacitors may also have a bias voltage be developed on them.

Figure 6B:
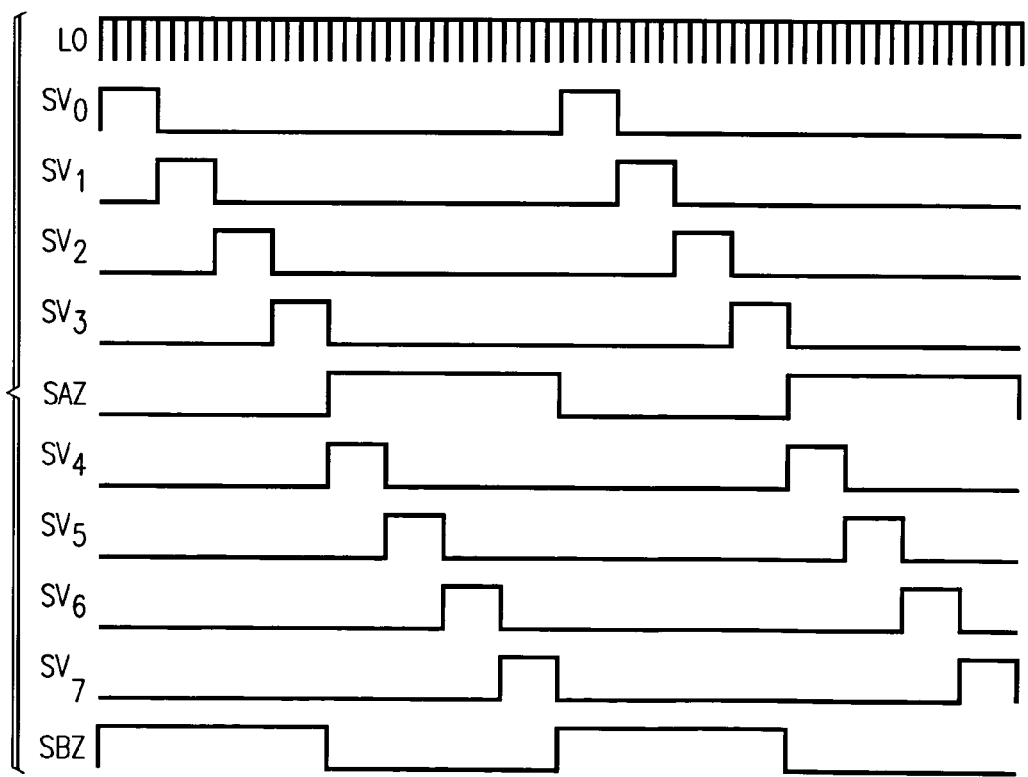
FIGS. 6a-c illustrate the use and timing of two current-mode sampling mixers, each with two banks of rotating capacitors with separate RF switches according to a preferred embodiment of the present invention.
Figure 6A:
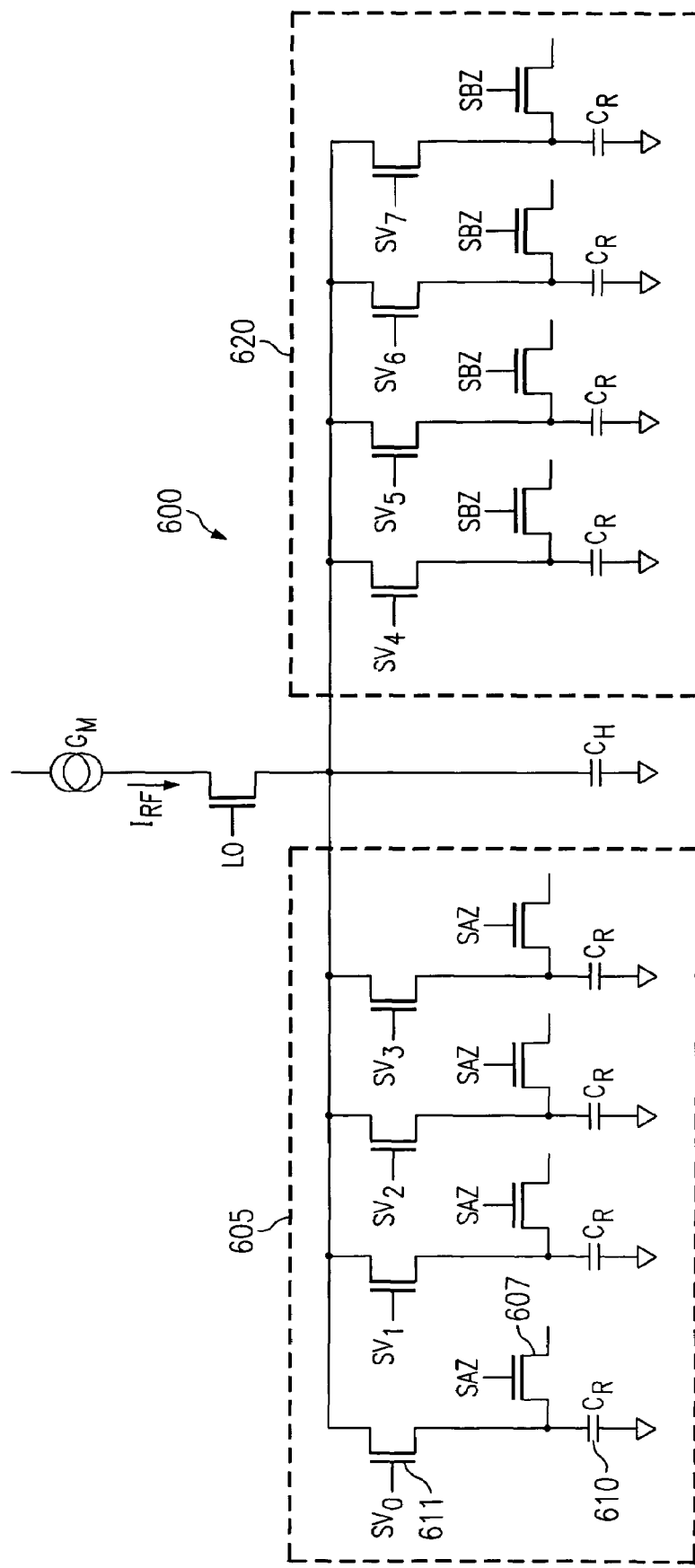

Referring now to FIG. 6a, a block diagram illustrates a current-mode sampling mixer 600 with two banks of rotating capacitors 605 and 620 and a separate RF switch according to a preferred embodiment of the present invention. Each rotating capacitor, for example, capacitor 610, is flanked by a switch 607, which is controlled by a charge read out signal. When the charge read out signal is active, the charge on the rotating capacitor can be read through the switch 607. Flanking the charge read out switch is another switch 611. This switch 611 is controlled by a signal that activates and deactivates the rotating capacitor for integrating of the RF current. FIG. 6b illustrates the timing of the signals controlling the operation of the mixer 600.

Figure 6C:
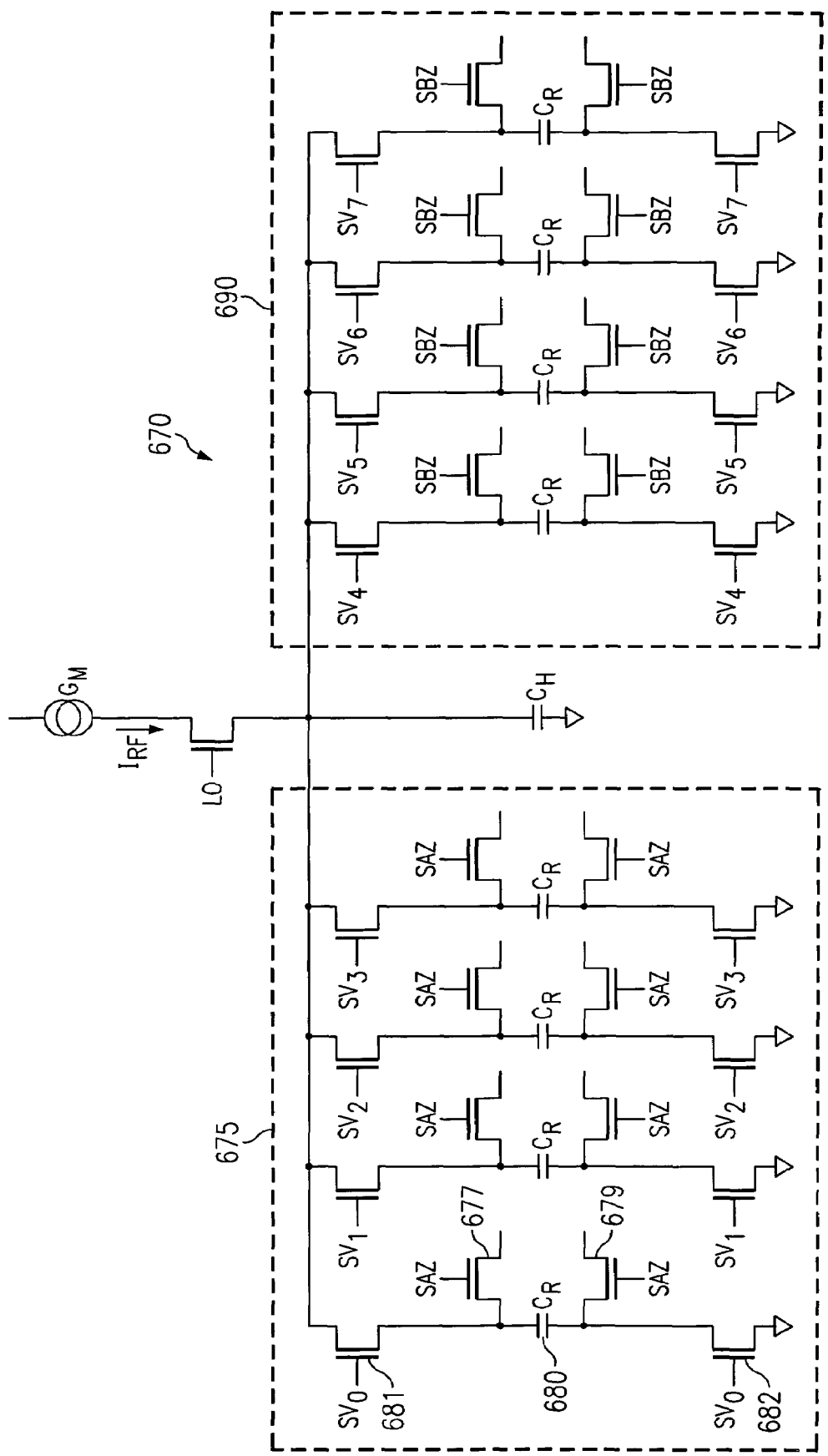

Referring now to FIG. 6c, a block diagram illustrates a current-mode sampling mixer 670 with two banks of rotating capacitors 675 and 690 and a separate RF switch according to a preferred embodiment of the present invention. The mixer 670 is essentially the same as the mixer 600 displayed in FIG. 6a, with the exception that a rotating capacitor, for example, rotating capacitor 680, is flanked by two switches 677 and 679 that are used to control the charge read out and two other switches 681 and 682 control the integration of the RF current by the rotating capacitor. A useful feature of this particular embodiment is that the charge read out can occur without requiring a coupling to electrical ground. This may be advantageous in a situation such as when the read out charge is coupled to a feedback path of an operational amplifier.

Figure 7A:
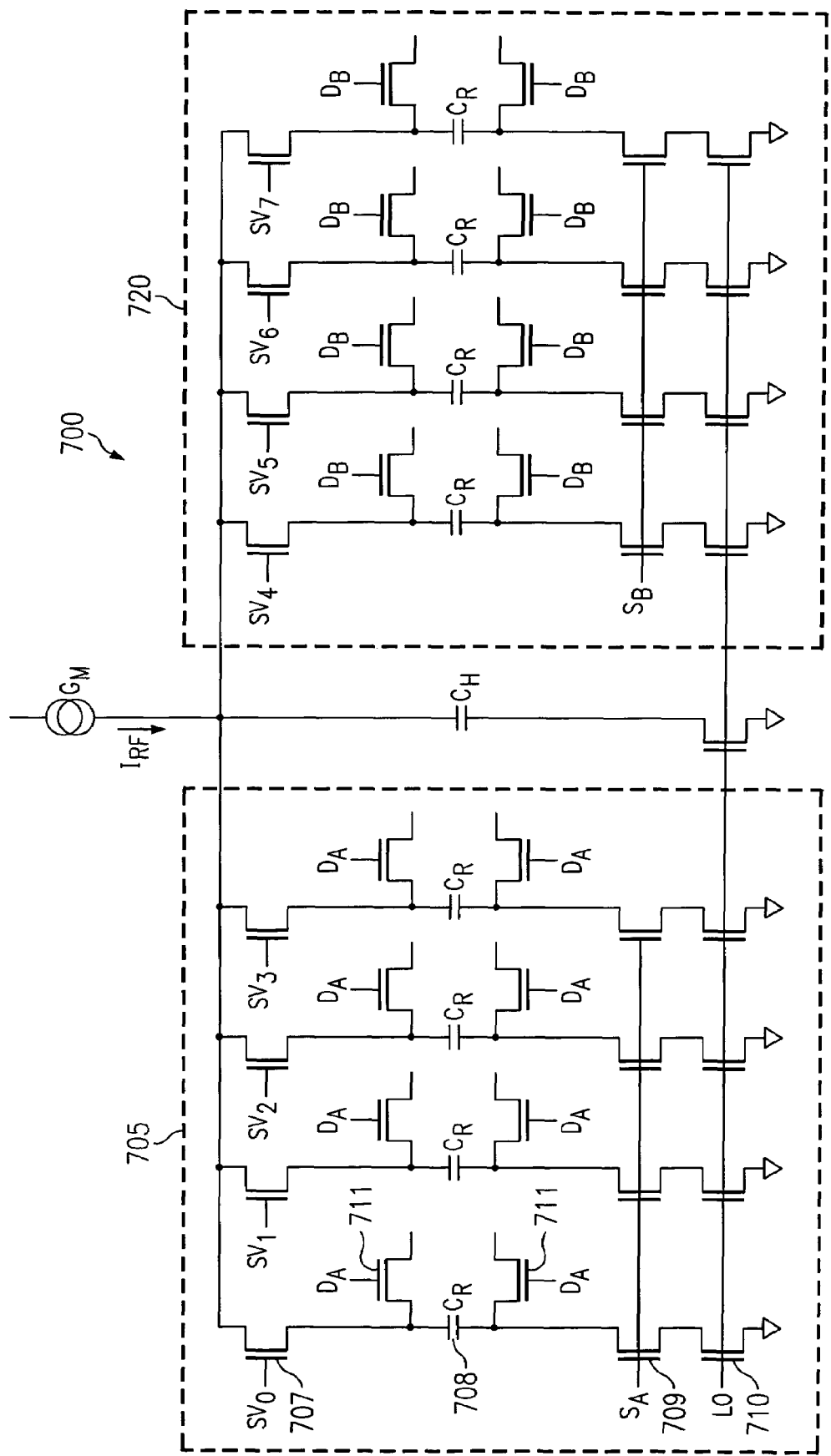
FIGS. 7a and 7b illustrate the use and timing of a current-mode sampling mixer with two banks of rotating capacitors arranged to make use of the bottom-plate sampling technique according to a preferred embodiment of the present invention.
Figure 7B:
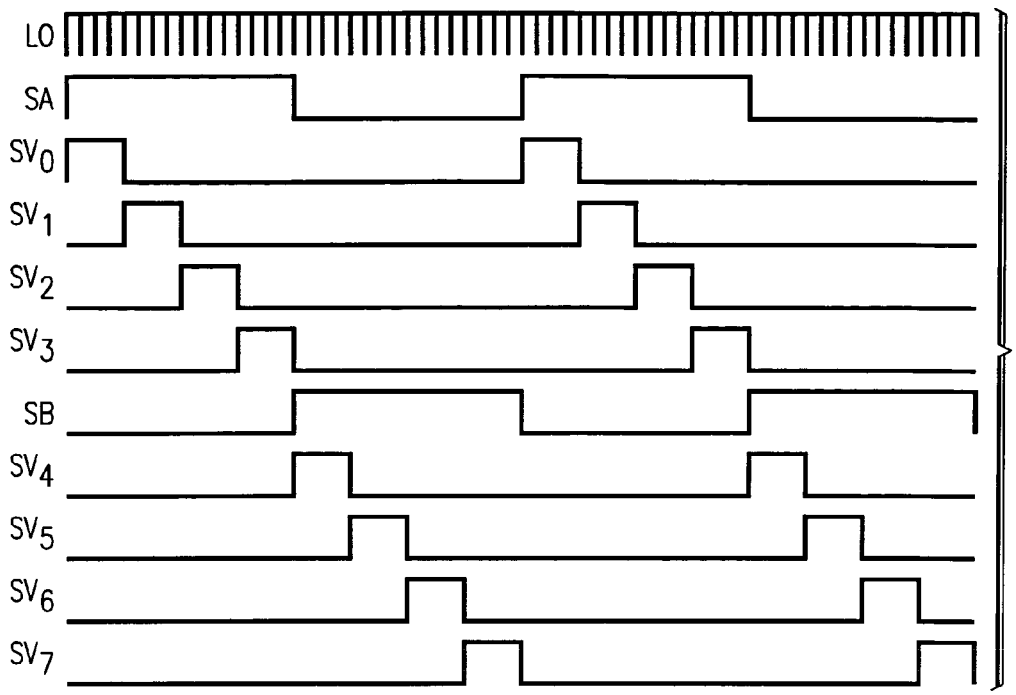

Referring now to FIG. 7a, a block diagram illustrates a current-mode sampling mixer 700 with two banks of rotating capacitors 705 and 720 arranged to make use of a bottom-plate sampling technique according to a preferred embodiment of the present invention. The bottom-plate sampling technique is a widely known and used technique in the field of switched capacitor circuits. The use of bottom plate switching offers an advantage in reducing the clock feedthrough and charge injection into the system. Each rotating capacitor, for example, capacitor 708, is coupled to electrical ground by a pair of switches. A first switch 709 is controlled by a sampling control signal and a first RF switch 710 is controlled by a signal generated by the LO. According to a preferred embodiment of the present invention, when both the sampling signal and the LO signal are high, then the rotating capacitor 708 may integrate the RF current if its sampling control signal is also active. A second switch 707 is controlled by the sampling control signal. An additional switch pair (displayed as two switches labeled 711) is used to permit the charge read out. FIG. 7b illustrates the timing of the signals controlling the operation of the mixer 700.

Due to differences between the impedance of the mixer and desired output impedance, an active buffer is required to isolate the mixer from the output. Typically, the mixer has a high impedance while it is desired that the output has a low driving impedance. The active buffer can also be used to realize a second, lower-rate IIR filtering operation through the use of passive charge sharing.

Figure 8:
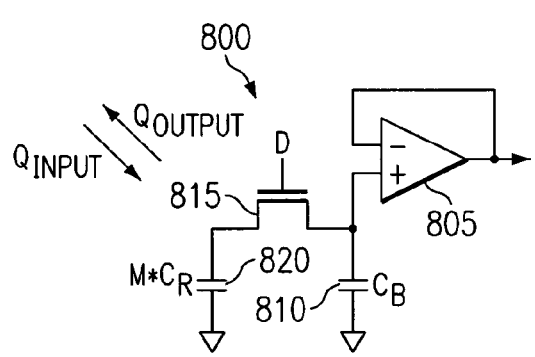
FIG. 8 illustrates an active buffer used to realize a second infinite-impulse response filter stage according to a preferred embodiment of the present invention.

Referring now to FIG. 8, a diagram illustrates the use of an active buffer 805 to realize a second IIR filtering stage 800 according to a preferred embodiment of the present invention. The buffer 805 actually does not play an active role in the IIR filtering operation. Rather, it is used to sense voltage from a buffer capacitor 810, $C_B$, and to present it to the output with a low driving impedance. An RF switch 815 couples the rotating capacitors 820 (displayed here as a single capacitor of value $M*C_R$) to the buffer capacitor 810 during the charge read out phase. As discussed previously, M is the number of rotating capacitors in a single capacitor bank, and in this example, M=4. At the end of the charge read out phase, the switch 815 opens, disconnecting the rotating capacitors 820 from the capacitor 810. After being disconnected, the rotating capacitors 820 have their charge reset. It is the resetting of the charge stored on the rotating capacitors that gives rise to the IIR filtering operation. According to a preferred embodiment of the present invention, the IIR filtering operation is referred to as an IIR-2 filtering operation.

Figure 9:
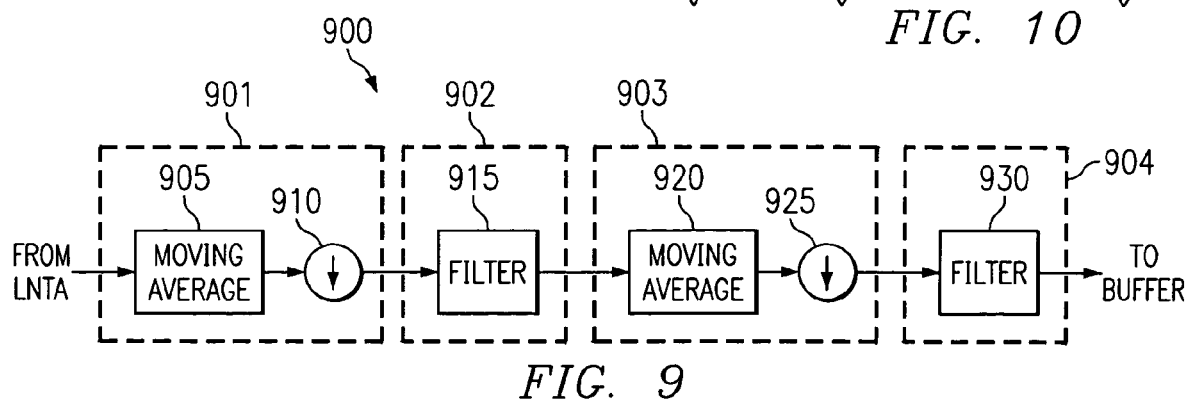
FIG. 9 illustrates the signal processing performed by a current-mode sampling mixer according to a preferred embodiment of the present invention.

Referring now to FIG. 9, a block diagram illustrates a current-mode sampling mixer 900 grouped by the signal processing steps that it performs according to a preferred embodiment of the present invention. According to a preferred embodiment of the present invention, the signal processing performed by the mixer can be logically viewed as four distinct FIR/IIR filtering operations. A first FIR filtering operation 901 arising from a combination of a moving average operation 905 and a decimation operation 910 resulting from the configuration of the rotating capacitors (such as one displayed in FIG. 3a). The moving average and decimation operations are the result of the integrating of N consecutive cycles of the RF current by a single rotating capacitor. A second filtering operation 902 is an IIR filtering operation (displayed in FIG. 9 as a filter 915) and referred to as an IIR-1 operation. The IIR-1 filtering operation arises from the presence of the history capacitor and the continuous integration of the RF current by the history capacitor and its use in conjunction with the rotating capacitors. The filtering operation 915 is determined by the ratio of the history capacitor, $C_H$, to the value of the rotating capacitors, $C_R$. The IIR-1 filtering operation has a Z-domain pole located at $a_1$, where $a_1$ is a number smaller than 1.

A third filtering operation 903 is a second FIR filtering operation that is a combination of a second moving average operation 920 and a second decimation operation 925. These two operations result from the configuration and arrangement of the rotating and buffer capacitors (such as displayed in FIG. 8). The second moving average and decimation operations 920 and 925 are directly dependent of the number of rotating capacitors in a rotating capacitor bank. According to a preferred embodiment of the present invention, the number of capacitors in a rotating capacitor bank is four. Therefore, the moving average operation 920 is a moving average of four and the decimation operation 925 is a decimation by four. Finally, a fourth filtering operation 904, an IIR filtering operation referred to as an IIR-2 operation, also arises from the configuration of the rotating and buffer capacitors. The IIR-2 operation is achieved at the end of the charge dump phase, when the rotating capacitors 820 are disconnected from the buffer capacitor 810 and any remaining charge on the rotating capacitors 820 are reset prior to returning to actively integrating the RF current. It is the resetting of the charge that gives rise to the IIR-2 operation. The filtering operation 930 has a Z-domain pole located at $a_2$, where $a_2$ is defined as $C_B/(C_B + M*C_R)$, where $C_B$ is the value of the buffer capacitor (810, FIG. 8) and $M*C_R$ is the number of capacitors in a rotating capacitor bank (M) multiplied by the value of a rotating capacitor ($C_R$). The behavior is expressible in equation form:

$$z_k = a_2(z_{k-1} + y_k) = a_2 z_{k-1} + a_2 y_k$$

where: $y_k$ is the input charge, $z_k$ is the charge stored on the buffer capacitor $C_B$ 810 at sampling time k.

As discussed previously, a bias voltage may be placed onto the rotating capacitors after the rotating capacitors have had their accumulated charges read out and reset. For example, the bias voltage on the rotating capacitors may be set to a specified value to prevent accumulated charge on the history capacitor from exceeding a maximum (or minimum) amount of charge that the capacitor can hold. A saturation of the charge holding capability of the history capacitor is a concern since it is constantly integrating the RF current, while each of the rotating capacitors is reset after integrating the RF current for N RF cycles. One way to accomplish the setting of a bias voltage onto the rotating capacitors is through the use of a feedback correction loop, wherein a feedback current is integrated by a feedback capacitor, which in turn shares its charge with the rotating capacitors.

Figure 10:
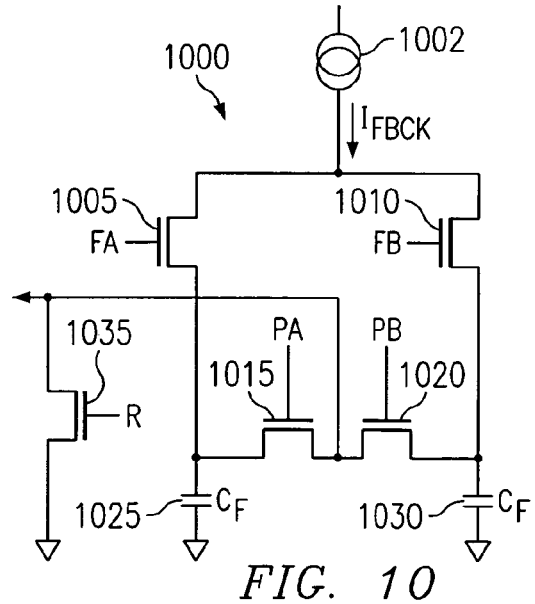
FIG. 10 illustrates a feedback charge accumulation structure used to establish a bias voltage (by periodically initializing a charge) on the rotating capacitors according to a preferred embodiment of the present invention.

Referring now to FIG. 10, a block diagram illustrates a feedback charge accumulation structure 1000 used to initialize the charge on rotating capacitors according to a preferred embodiment of the present invention. An amplifier 1002, with a gain of $g_m$ (which, according to a preferred embodiment of the present invention, may be realized as a current-mode digital-to-analog converter (DAC)), produces a desired feedback current, $i_{FBCK}$, and when either switches FA 1005 or FB 1010 is closed, the feedback current is integrated by one of two feedback capacitors, $C_F$, 1025 or 1030. The charge stored on the feedback capacitor is shared with the rotating capacitors (not shown) when either switch PA 1015 or PB 1020 is closed. Another switch 1035, R, shunts the charge to ground, resetting the charge on the rotating capacitors, prior to the precharging operation. The timing of the switches will be discussed below.

It is advantageous to utilize the feedback charge accumulation structure (FIG. 10) to create a higher-level correction loop. In addition to the current-mode sampling mixer, the higher-level correction loop can involve an analog-to-digital converter (ADC) or quantizer, digital filtering and other digital signal processing functions, such as sigma-delta conversion. Examples of possible uses of the higher-level correction loop include: removing close-in interferers and linearizing the current-mode sampling mixer. To remove close-in interferers, output of the ADC can be digitally processed to detect the interferers and appropriately phase shifted and scaled samples can be used to constructively remove the interferers. Linearizing the current-mode sampling mixer involves the digital processing of the output of the ADC so that appropriately phase-shifted and scaled samples injected into the mixer would linearize the datapath.

Figure 11A:
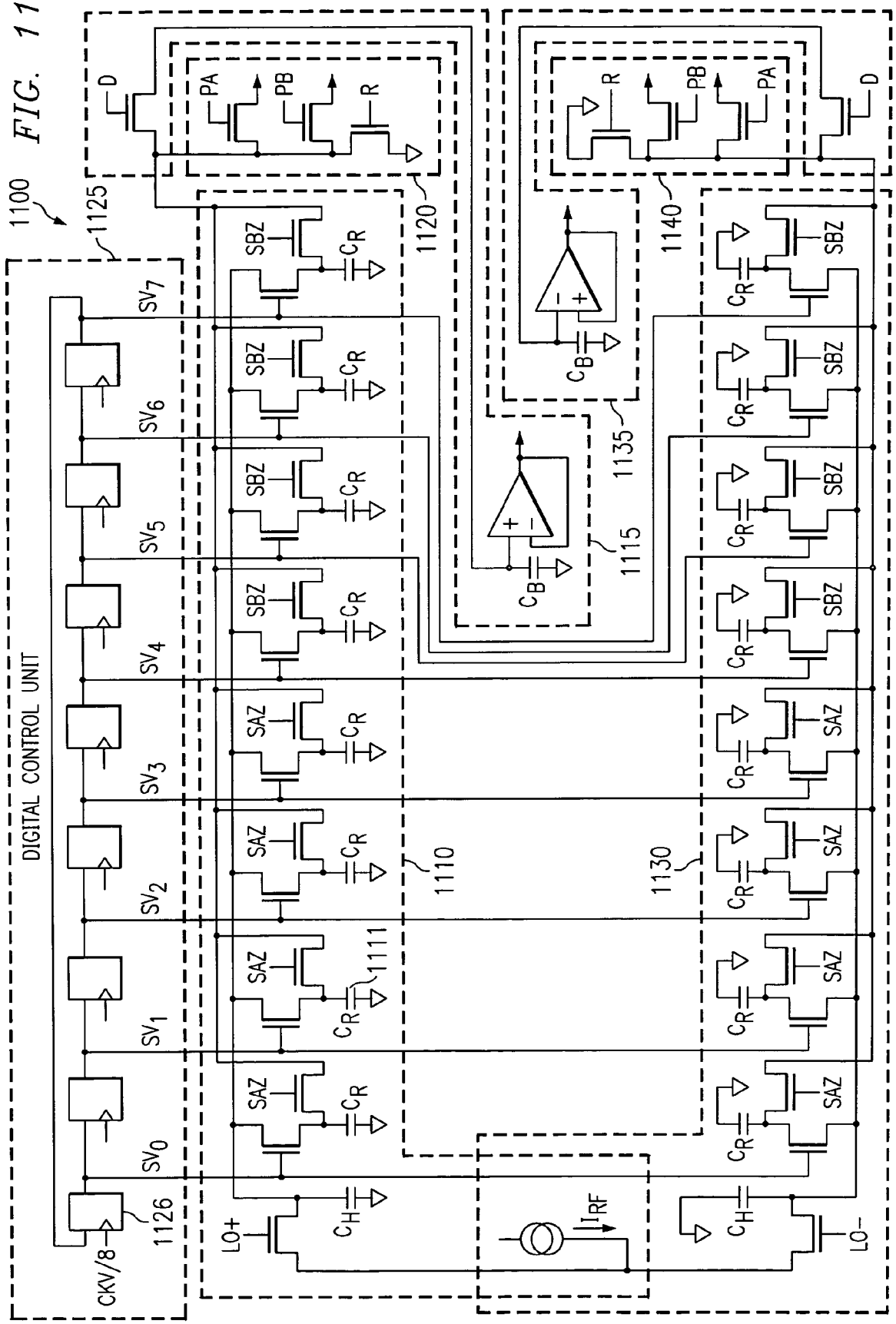
FIGS. 11a and 11b illustrate a physical implementation of a portion of a current-mode sampling mixer along with a detailed view of a portion of a clock generating circuit according to a preferred embodiment of the present invention.

Referring now to FIG. 11a, a block diagram illustrates a physical implementation of a portion of a current-mode sampling mixer 1100 according to a preferred embodiment of the present invention. According to a preferred embodiment of the present invention, the mixer 1100 processes both the in-phase (I) and quadrature-phase (Q) sampled versions of the received signal and operates in differential signaling mode, i.e., each of the signal streams is represented by a positive and a negative stream. Therefore, the mixer 1100 processes the I+, I−, Q+, and Q− signals. FIG. 11a displays the I (both I+ and I−) signal path portion of the mixer, although the Q signal path of the mixer is similar. While the use of the in-phase and quadrature-phase signal paths imply the presence of orthogonal signal bases, the present invention can make use of non-orthogonal signal bases as well.

The I signal path of the mixer 1100 includes a I+ sampling structure 1110, an I+ second IIR filter 1115, a portion of a I+ feedback charge accumulation structure 1120, a digital control unit (DCU) 1125, an I− sampling structure 1130, an I− second IIR filter 1135, and a portion of a I− feedback charge accumulation structure 1140. The I+ sampling structure 1110 (and I− sampling structure 1130) is as described in FIG. 6a. The I+ second IIR filter 1115 (and I− second IIR filter 1135) is as described in FIG. 8 and the I+ feedback charge accumulation structure 1120 (and I− feedback charge accumulation structure 1140) is as described in FIG. 10. Note that a portion of the I+ feedback charge accumulation structure 1120 (and I− feedback charge accumulation structure 1140) is not displayed in FIG. 11a for simplicity reasons, but are present in a preferred embodiment of the present invention.

According to a preferred embodiment of the present invention, the DCU 1125 is used to generate signals to activate and deactivate rotating capacitors, along with other signals used to control the operation of the mixer 1100. Note that hardware used to generate the other signals is not displayed in FIG. 11a. The generation of the signals used to activate and deactivate the rotating capacitors is implemented using a shift-register, with the number of registers being equal to the total number of rotating capacitors per signal path. For example, there are two banks of four rotating capacitors per signal path for a total of eight rotating capacitors and therefore, there are eight registers in the shift-register. Each register in the shift-register is driven by a clock that is equal to the period of the LO divided by eight, since N=8 (decimation value). Again, should a different value of N be used, the division of the LO signal would necessarily be different.

According to a preferred embodiment of the present invention, a circular shift register with a rotating bubble is used. The bubble shift register is different from a normal circular shift register in that the contents of all but one register contains the same value, while the one register contains a different value, i.e., the bubble. The bubble shift register is initialized into the following state: a one value is stored in one of the registers (for example, register 1126) and the remaining registers store a zero value. Then, each time the registers in the shift register are clocked (once every eight cycles of the LO), the one value moves from its current register to the register adjacent to it. Note that the registers are connected in a circular fashion so that the output of the last register in the shift register rolls around and becomes the input of the first register in the shift register.

Figure 11B:
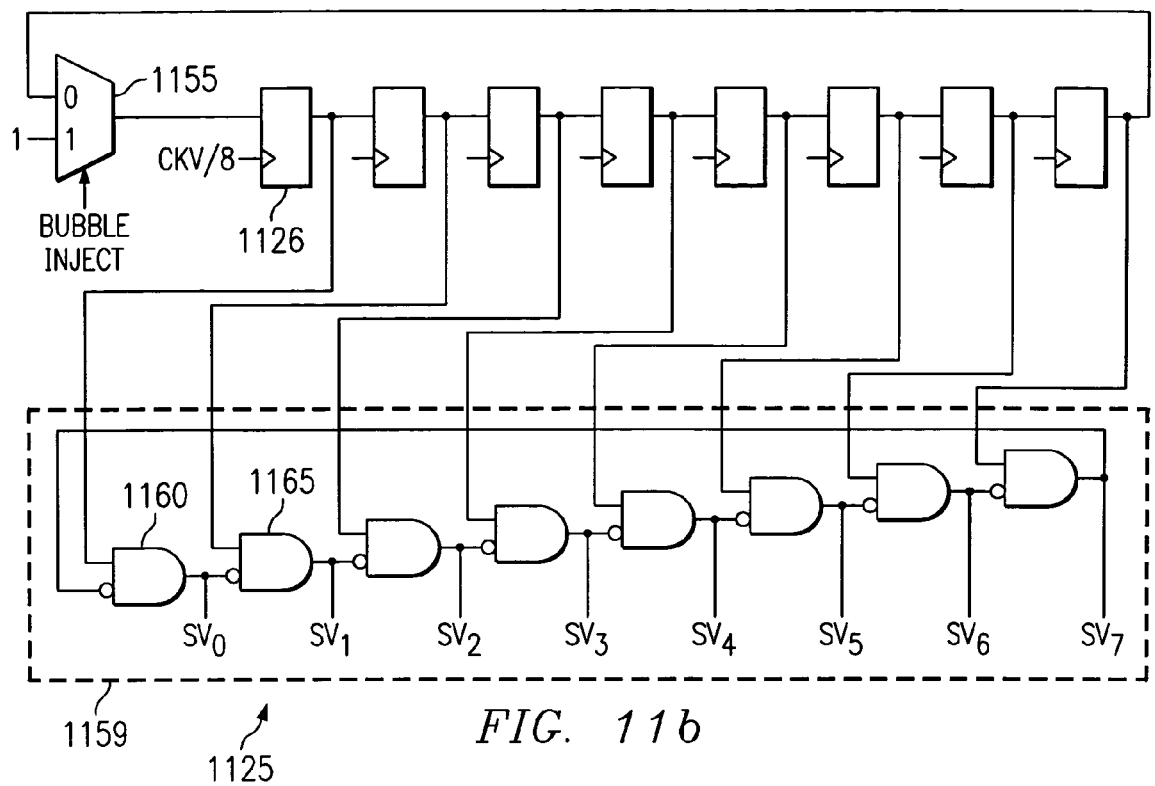

Referring now to FIG. 11b, a block diagram presents a detailed view of the bubble shift register according to a preferred embodiment of the present invention. FIG. 11b presents a view of the bubble shift register in greater detail along with a non-overlap circuit, which will be discussed below. The bubble shift register includes a sequential string of registers, like a normal circular shift register and a multiplexer 1155. The multiplexer 1155 allows control circuitry (not shown) to select the input into one of the registers in the shift register chain. For example, the signal driving the input of register 1126 can either be the output of the register immediately before it or a binary one value. The multiplexer 1155 is controlled by a bubble inject line. If the bubble inject line selects the output of the previous register (bubble inject line equals zero (0)), then the bubble shift register operates in a manner similar to a normal circular shift register. If the bubble inject line selects the binary one value (bubble inject line equals one (1)), then the binary one value becomes the input into the register 1126. This loads the one value into the bubble shift register. According to a preferred embodiment of the present invention, the bubble shift register initializes into a zero state where all of the registers in the bubble shift register is cleared. Then, the binary one is loaded into one of the registers of the bubble shift register and normal operation can commence. It is preferred that the bubble shift register be loaded only one time.

The use of shift registers is an efficient way of generating the signals required to control the activation (and deactivation) of the rotating capacitors. For example, through the use of the bubble shift register, the power consumed is reduced due to a reduction in the total number of signal transitions. This is because each time the bubble shift register is clocked, there are only two signal transitions. Additionally, by using only bubble shift registers to generate the signals, the signal generating hardware is greatly reduced (when compared to a complex array of combinatorial logic), hence there is a reduction in both hardware design complexity and power consumption.

Whichever register contains the one value produces a control signal that is high, while the remaining signals produced by the bubble shift register is low. The rotating capacitor associated with the register producing the control signal with the high value is active and is used to integrate the RF current. After a certain number of RF clock cycles, for example, eight RF clock cycles, the bubble shift-register is clocked and the one value moves to the next register in the shift register and the rotating capacitor that was formerly active becomes inactive and the rotating capacitor associated with the next register becomes active.

Since the bubble shift register in the DCU 1125 is a synchronous device, each time that the bubble shift register is clocked (for example, once every eight RF cycles), the contents of the registers immediately changes. Because of the immediate change in the value of the various control signal lines, a situation may arise when more than one rotating capacitor is active at one time. This is not desired because it can result in the integrating of the RF current on two different rotating capacitors. To remedy this situation, a non-overlap circuit 1159 is needed.

The non-overlap circuit 1159 is a combinatorial circuit used to insert a gate transition delay between the time when a first control signal changes state (for example, transitioning from high to low) and a second changes state (for example, transitioning from low to high) as a result of the first control signal. The non-overlap circuit 1159 is made up of a linear sequence of two-input AND logic gates arranged in a circular fashion, similar to the circular shift register discussed above. The output of one AND gate becomes a first input of the AND gate immediately following it. According to a preferred embodiment of the present invention, the first input is an inverted input. The second input (non-inverting) of the AND gate is the output of one of the registers in the bubble shift register.

The operation of the non-overlap circuit 1159 is as follows. Assuming that upon initialization or reset, the contents of registers in the bubble shift register are all zero. This places a zero at the second input of each of the AND gates in the non-overlapping circuit 1150, therefore, the outputs of all AND gates is zero. With the outputs of all AND gates equal to zero, a one is placed at the first input of each AND gate, due to the inverting nature of the first input. Once the bubble inject line changes value to load the one value into a register, for example, register 1126, the second input of the AND gate associated with the register 1126 (for example, AND gate 1160) becomes a one. With both inputs being one, the output of the AND gate becomes a one, changing the control signal $SV_0$ to one.

After N RF cycles (N=8 in this example) have elapsed, the bubble shift register is clocked, moving the bubble from register 1126 to the next register in the shift register. This places a one at the second input of AND gate 1165. With the first input of the AND gate 1160 no longer one, the output of AND gate 1160 becomes a zero, which becomes a one at the first input of AND gate 1165 (due to the inverting nature). The output of AND gate 1165 now becomes a one and the control signal $SV_1$ becomes a one. This process continues as long as the bubble shift register is being clocked.

The non-overlap circuit 1159 inserts a delay equal to one AND gate in between the time when the output of one register changes to when the corresponding control signal changes. It is the propagation delay of the AND gate that causes the non-overlap. Should additional delay be desired, buffers can be added between the outputs and inputs of the AND gates. For example, a couple of inverters will add two inverter delays without changing the values of the signals involved.

Additional control signals may be derived using combinatorial logic based on the output of the bubble shift register. For example, a signal used for activating and deactivating a capacitor bank can be derived by combining the outputs of the registers in the bubble shift register in a multi-input OR logic gate. The signal responsible for activating/deactivating a capacitor bank would combine the outputs of all registers associated with rotating capacitors in the capacitor bank. Therefore, when one of the rotating capacitors in the capacitor bank is to be activated, the entire bank is activated. Similarly, a reset signal can be derived by combining the outputs of the registers associated with rotating capacitors N−1 of the various capacitor banks and a precharge signal can be derived by combining the outputs of the registers associated with rotating capacitors N of the various capacitor banks. For example, if there are two capacitor banks with four rotating capacitors each, then the reset signal would be derived from the logical OR of the register outputs associated with rotating capacitors two and six (assuming the capacitors are numbered zero to three and four to seven) and the precharge signal would be derived from the logical OR of the register outputs associated with rotating capacitors three and seven.

Figure 12:
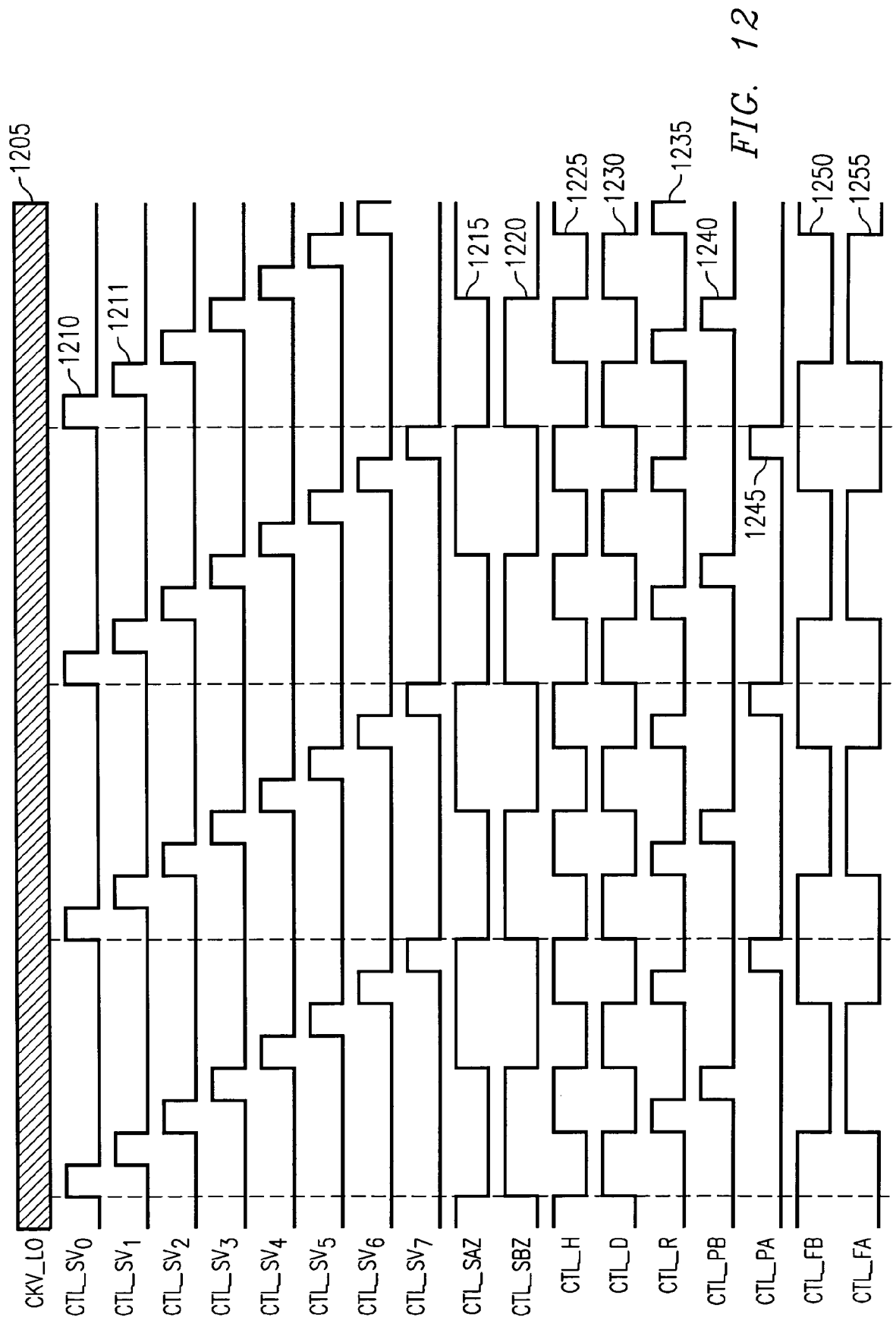
FIG. 12 illustrates the timing between signals used for activating rotating capacitors used in the current-mode sampling mixer of FIG. 11a according to a preferred embodiment of the present invention.

Referring now to FIG. 12, a timing diagram illustrates the relationship between various signals used in the mixer 1100 according to a preferred embodiment of the present invention. A first timing trace 1205 displays a signal generated by a LO. Note that the frequency of the signal is so great that the timing trace 1205 appears to be a solid line. A second timing trace 1210 displays the signal "$SV_0$" used to control a rotating capacitor 1111 (FIG. 11a). The signal "$SV_0$" is also used to control a rotating capacitor in the I− signal path as well as the other two signal paths (not shown). Other timing traces display the other SV signals for controlling the other rotating capacitors. Notice a pulse on a third timing trace 1211 displaying the signal "$SV_1$" begins a small amount of time after the pulse on the second timing trace 1210 ends. Note that due to display limitations, FIG. 12 displays the traces as if one trace begins immediately after another trace ends when there is actually a small amount of time between the end of one pulse and the beginning of another. The delay between pulses on the timing traces is due to the non-overlap circuit 1159 (FIG. 11b) discussed above.

A fourth timing trace 1215 displays the "SAZ" signal. The SAZ signal is used to deactivate the rotating capacitor bank A. When the SAZ signal is high, the charge on the rotating capacitors in bank A is read out and various other operations such as a reset, followed by a precharging of the rotating capacitors to a specified value, turning on the feedback charge accumulation structure, etc. A fifth timing trace 1220 displays the "SBZ" signal. The SBZ signal performs the operations associated with the SAZ signal for the rotating capacitor bank B.

A seventh timing trace 1230 displays the "CTL_D" signal used to couple the rotating capacitor bank to the buffer capacitor, $C_B$ (discussed in FIG. 8), allowing the charge from the rotating capacitors to be shared with the buffer capacitor, resulting in the charge on the rotating capacitors appearing on the output of the buffer.

An eighth timing trace 1235 displays the "CTL_R" signal used to couple an inactive rotating capacitor bank (the one that is not currently integrating the RF current) to electrical ground. A ninth timing trace 1240 displays the "CTL_PB" signal used to couple a feedback capacitor, $C_F$, to rotating capacitor bank B, while a tenth timing trace 1245 displays the "CTL_PA" signal used to couple a different feedback capacitor, $C_F$, to rotating capacitor bank A.

An eleventh timing trace 1250 displays the "CTL_FB" signal used to allow the feedback capacitor, $C_F$, to integrate the feedback current, $i_{FBCK}$, intended for rotating capacitor bank B. A twelfth timing trace 1255 displays the "CTL_FA" signal, performing the same operation as the "CTL_FB" signal except for rotating capacitor bank A.

The four signal paths (I+, I−, Q+, and Q−) in the mixer 1100 correspond to phase differences with respect to the signal generated by the LO. For example, I+ corresponds to a zero (0) degree phase difference with the LO, while I− corresponds to a 180 degree phase difference, and Q+ and Q− are 90 and 270 degrees of phase difference from the LO signal respectively. To generate the different SV signals for activating different rotating capacitors in the different signal paths, it is typical to have a single LO generate a reference signals and then have signal generating hardware to generate the required SV signals for the signal paths.

Figure 13:
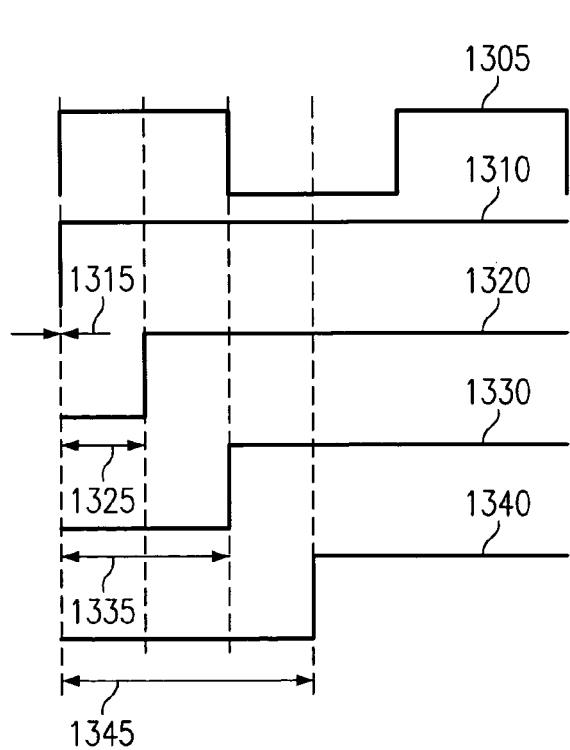

Referring now to FIG. 13, a timing diagram illustrates the ideal phase angle differences between the $SV_0$ signals for each of the four signal paths in the mixer 600. A first timing trace 1305 displays a signal generated by the LO. A second timing trace 1310 displays the SV0 signal for signal path I+. According to a preferred embodiment of the present invention, the LO used to generate the reference clock signal is also used for the signal path I+. Since the phase difference between the LO and the I+ signal is zero degrees, there is no difference between the start of the SV0 signal and the LO signal (displayed as interval 1315). A third timing trace 1320 displays the SV0 signal for signal path Q+. With a 90 degree phase difference between the Q+ signal and the LO, the difference between the start of the SV0 signal and the LO signal (displayed as interval 1325) is a quarter of the period of a single LO period.

A fourth timing trace 1330 displays the SV0 signal for signal path I−. Since the phase difference between the LO and the I− signal is 180 degrees, there is a half LO period difference between the start of the SV0 signal and the LO signal (displayed as interval 1335). A fifth timing trace 1340 displays the SV0 signal for signal path Q−. With a 270 degree phase difference between the Q− signal and the LO, the difference between the start of the SV0 signal and the LO signal (displayed as interval 1345) is three quarters of a LO period.

However, there is a large amount of hardware required to accurately generate the SV signals for the four different signal paths. When considering one of the major applications of the current-mode sampling mixer 1100 is in portable wireless communications devices, power consumption is of the utmost importance. Any reduction in power consumption is desirable because it increases battery life.

Taking into account the capacitance of the history capacitor, $C_H$, when compared to the capacitance of the individual rotating capacitor, $C_R$, where $C_H = a_1 * C_S$ and $C_R = (1-a_1) * C_S$ with $a_1$ being a number less than one. According to a preferred embodiment of the present invention, $a_1 = 0.9686$, therefore, if $C_S = 15.925$ pF, then $C_R = 0.5$ pF and $C_H = 15.425$ pF. With the capacitance of $C_H$ being significantly larger than the capacitance of $C_R$, the majority of the RF current integrated by the two capacitors will be stored by the history capacitor, $C_H$, and not the rotating capacitor, $C_R$. Because of the fact that a very small charge is actually stored on the $C_R$ capacitors, a slight misalignment in the timing of the activate and deactivate signals for the rotating capacitors will not result in a significant degradation in performance, as long as the amount of time that each rotating capacitor spends integrating the RF current remains consistent. Taking advantage of the large difference between $C_H$ and $C_R$ and the superposition principle, a single LO can be used to generate all of the SV signals for all signal paths in the mixer.

For example, the signal from an LO generating signals with a zero degree phase difference would produce SV signals with no phase errors with the SV signals in the I+ signal path. The same SV signals would have a 180-degree phase deviation with the SV signals in the I− signal path. However, since the SV signals are eight LO periods long (according to a preferred embodiment of the present invention), the 180-degree phase deviation turns out to be a 6.25% deviance for the activate/deactivate signal. For the Q+ signal path, the same SV signals would have a 90-degree phase deviation (or 3.125% deviance) and for the Q− signal path, the 270-degree phase deviation would result in a 9.375% deviance.

While there exists a phase deviation, the duration of the periods of the SV signals remain accurate. It is the combination of the small size of the rotating capacitor (preferably less than 4% the size of the history capacitor) and the maintained accuracy in the duration of the SV periods that yields essentially the same results as if four different and independent clock generators were used to generate the SV signals for each of the four signal paths.

Figure 14:
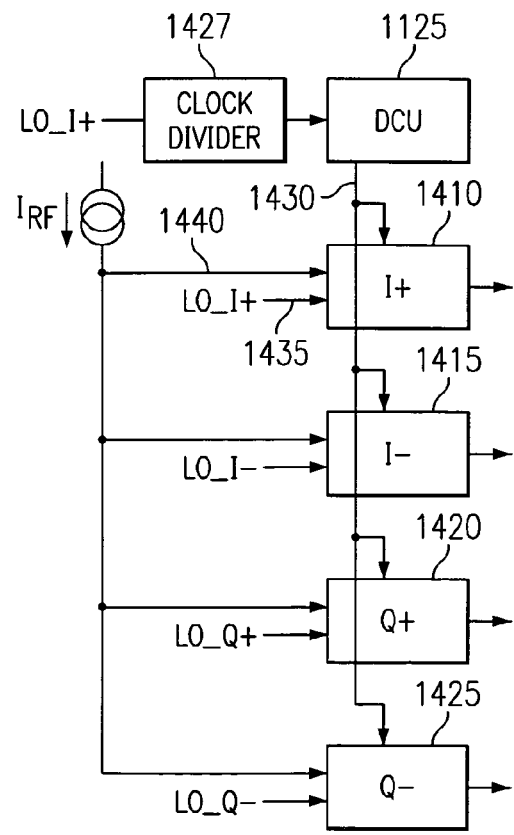
FIG. 14 illustrates a current-mode sampling mixer utilizing a local oscillator to derive a complete set of control signals for activating and deactivating rotating capacitors according to a preferred embodiment of the present invention.

Referring now to FIG. 14, a block diagram illustrates a current-mode sampling mixer utilizing a single LO to generate a complete set of signals for activating rotating capacitors according to a preferred embodiment of the present invention. The signals for activating the rotating capacitors and controlling the operation of the signal paths are generated in the DCU 1125. The DCU 1125 uses the divided signal from a single LO to generate its signals. The preferred signal is the signal of the I+ signal path since is in zero (0) degrees out of phase with the reference LO of the radio transceiver and the received RF data, however, the LOs from the other signal paths are equally usable with no needed adjustments for the phase angle deviation.

A clock divider 1427 divides the clock signal from the LO and provides the divided clock signal to the DCU 1125. Alternatively, the DCU 1125 contains its own clock divider circuitry and the signal produced by the LO is provided directly to the DCU 1125. According to a preferred embodiment of the present invention, the clock divider 1427 divides the signal provided by the LO by a factor of eight. This means that the clock divider 1427 will generate a single clock edge for every eight LO clock edges that it receives.

As discussed previously, the DCU 1125 uses a circular shift register to generate the activate and deactivate signals for the rotating capacitors. The signals generated by the DCU 1125 are provided to the individual signal paths I+ 1410, I− 1415, Q+ 1420, and Q− 1425 by a series of connections (displayed in FIG. 14 as a single connection 1430). The line 1430 provides the same set of signals to each of the four signal paths.

Each signal path is connected to a properly phased signal from the LO. For example, the I+ signal path 1410 is connected to the LO_I+ output of the LO. As discussed previously, the phase angle deviation presented to three of the four signal paths does not produce a measurable difference in the performance of the current-mode sampling mixer. Also coupled to the different signal paths is a transconductance amplifier that provides the RF current to the signal paths. The RF current is integrated in the signal paths, which produces discrete-time sample streams based on the integrated current. Each signal path provides an output in the form of a stream of discrete-time samples that are processed by the radio transceiver.

Figure 15A:
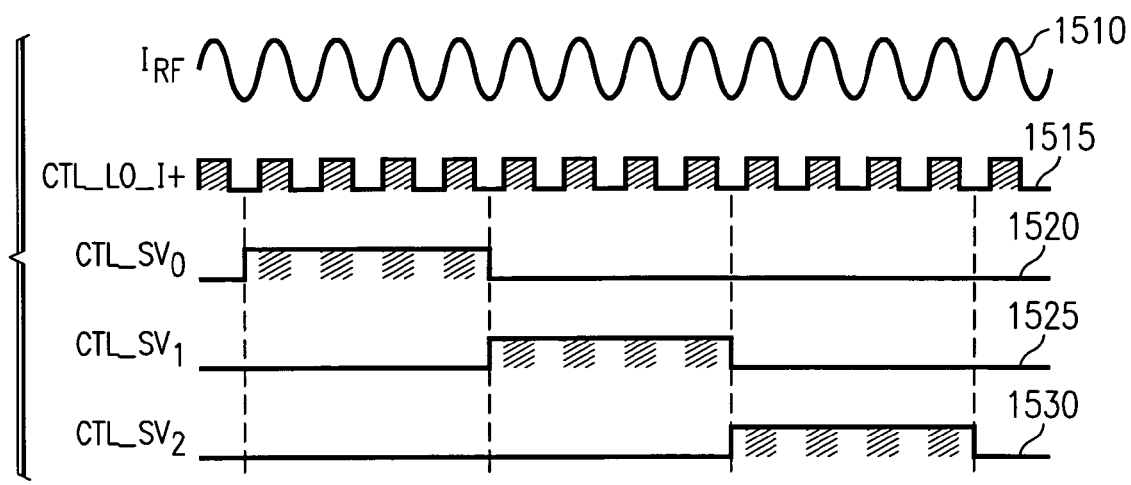
FIGS. 15a and 15b illustrate timing differences in rotating capacitor control signals when generated by independently executing clock generating circuitry and a single common clock generating circuit according to a preferred embodiment of the present invention.
Figure 15B:
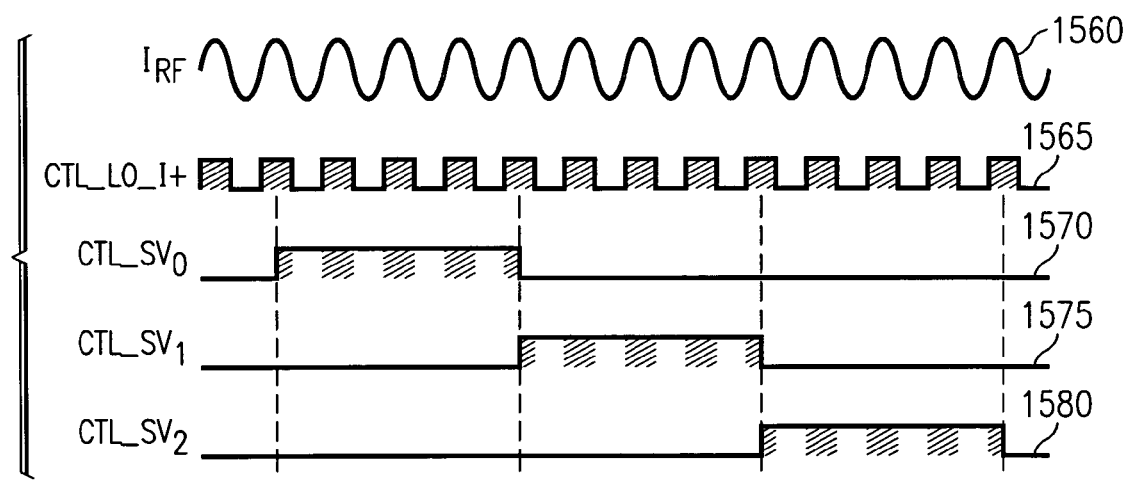

Referring now to FIGS. 15a and 15b, timing diagrams illustrate timing differences between rotating capacitor control signals that are generated by independently executing clock generating circuitry and signals that are generated by a single common clock generating circuit according to a preferred embodiment of the present invention. FIG. 15a illustrates rotating control signals that are generated by an independently executing clock generating circuit. A first curve 1510 displays an idealized RF current, labeled $I_{RF}$. A second curve 1515 displays a clock signal produced by an LO, in this example, the clock signal for the I+ signal path is displayed with positive portions (the portions that will close the RF switch permitting the integration of the RF current by rotating capacitors) of the signal shaded.

The next three curves 1520, 1525, and 1530 display three rotating capacitor control signals. Note that there may be other rotating capacitor control signals in the actual mixer, but that only three are displayed in FIG. 15a. Since the rotating capacitor control signals are derived directly from the clock signal for the I+ path, the rotating capacitor control signals are well centered in the negative portions of the I+ LO. During the negative portions of the I+ LO signal, the RF switch is open and stops the flow of RF current. Therefore the rotating capacitors are not integrating the RF current. Since the switching of the active rotating capacitors occurs during an inactive period, no RF current is lost.

Referring now to FIG. 15b, a timing diagram illustrates rotating control signals that are generated by a common executing clock generating circuit that is derived from a clock signal that deviates in phase angle with its own clock according to a preferred embodiment of the present invention. A first curve 1560 displays the RF current and a second curve 1565 displays a clock signal produced by an LO, in this example, the clock signal for the I+ signal path is displayed with positive portions (the portions that will close the RF switch permitting the integration of the RF current by rotating capacitors) of the signal shaded. Notice that as displayed in FIG. 15b, the clock for this particular signal path is different from the I+ LO signal and there is the phase angle deviation of about 180 degrees between the two. The actual phase angle deviation between the reference LO signal (in this example, the I+ LO) and the clock used for a particular signal path may be any value. For example, in a four signal path mixer with in-phase and quadrature-phase clocks, the phase angle deviations may be about zero, 90, 180, and 270 degrees.

Due to the phase angle difference being about 180 degrees, the rotating capacitor control signals transition in the middle of a time period when the rotating capacitors are integrating the RF current instead of being in the middle of the inactive time period. However, due to the maintained accuracy in the duration of the rotating capacitor control signals, the rotating capacitors remain active for precisely the same amount of time as if their own lo independent clock generating circuit was generating the control signals. When one rotating capacitor transitions from active to inactive in the middle of integrating the RF current, another rotating capacitor transitions from inactive to active and integrates the remainder of the RF current, so the amount of RF current not integrated by the rotating capacitor may be very small.

Compounded with the relatively small capacitance of the rotating capacitors (approximately 30 times smaller than the history capacitor) and the fact that the history capacitor continually integrates the RF current, the total amount of RF current not integrated is negligible and does not affect the performance of the mixer.

Figure 16:
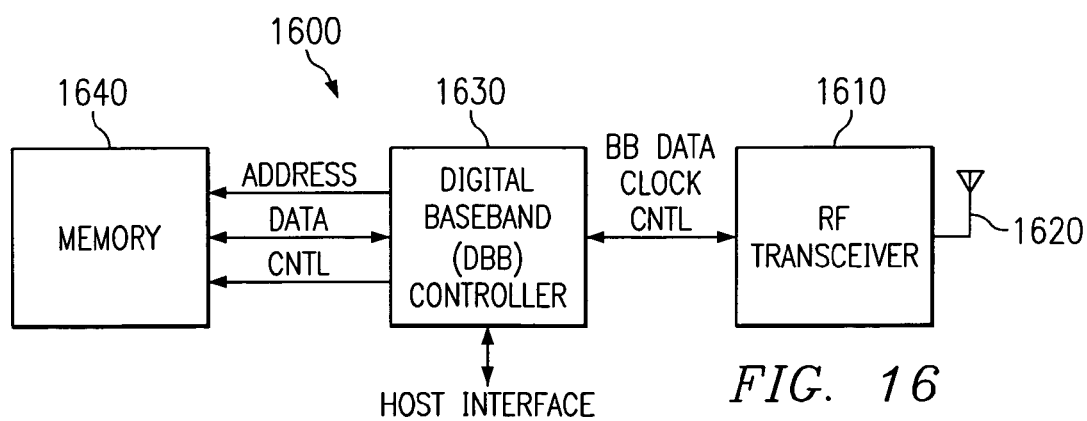
FIG. 16 illustrates a block diagram of a wireless communications device containing a direct sampling mixer according to a preferred embodiment of the present invention.

Referring now to FIG. 16, a block diagram illustrates a wireless communications device 1600 containing a direct sampling mixer according to a preferred embodiment of the present invention. As discussed previously, the direct sampling mixer of the present invention is operable at any radio frequency and with any data encoding and transmission mechanism. In actuality, the direct sampling mixer is also operable in a wired communications system as well.

The direct sampling mixer of the present invention is contained in an RF transceiver 1610 that is coupled to an antenna 1620. The antenna 1620 is responsible for receiving analog RF signals transmitted over-the-air. Additionally, the antenna 1620 may be used to transmit analog RF signals originating from the wireless device 1600. The RF transceiver 1610 is responsible for taking the analog RF signals received by the antenna 1620 and converting it into a digital data stream that is usable by the remainder of the wireless device 1600. Since the RF transceiver 1610 can transmit signals as well as receive them, the RF transceiver 1610 is also responsible for converting a digital data stream into an analog signal suitable for transmission.

After the RF transceiver 1610 receives and then converts the analog RF signal into a digital data stream by an analog-to-digital converter (ADC) or a quantizer (neither shown), the digital data stream is transferred to a digital baseband (DBB) controller 1630. The DBB controller 1630 is responsible for taking the digital data stream and perform any necessary digital signal processing on it to convert the digital data stream in to a stream of user usable data. Examples of the processing performed by the DBB controller 1630 may include, but is not limited to: digital filtering, data encoding and decoding, error detection and correction, and communications protocol software stack and applications. The DBB controller 1630 is coupled to a memory 1640 that may contain a read-only memory (ROM), a random access memory (RAM), flash programmable memory, etc. The memory 1640 can be used to store necessary subroutines used in the DBB controller 1630, configuration data, scratch memory, etc.

The DBB controller 1630 may be coupled to some other digital device via a host interface. The host interface may be a proprietary interface or it may be adherent to an interconnection standard such as: RS-232, universal serial bus, Firewire, IEEE 802.11, PCcard, etc. The host interface allows the connection of a digital device to the wireless device 1600 via the DBB controller 1630. Examples of digital devices include computers, multi-media devices, Internet appliances, storage devices, etc.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for generating clock signals for use in activating and deactivating rotating capacitors in a receiver mixer with a plurality of signal paths to sample a received data signal, the method comprising:
   producing a reference signal;
   generating a set of clock signals from the reference signal; and
   distributing the set of clock signals to the plurality of signal paths, wherein the set of clock signals are used to activate and deactivate rotating capacitors in each of the signal paths.

2. The method of claim 1, wherein the set of clock signals are also used to activate and deactivate a bank of rotating capacitors.

3. The method of claim 1, wherein the set of clock signals are also used to reset and precharge rotating capacitors in each of the signal paths.

4. The method of claim 1, wherein the producing step comprises using a local oscillator (LO) to produce the reference signal.

5. The method of claim 4, wherein the reference signal approximately equals the carrier frequency of the received data stream.

6. The method of claim 1, wherein the generating step comprising:
   producing a clock signal by dividing the reference signal by an integer amount, N; and
   providing the clock signal to a signal generator.

7. The method of claim 6, wherein the signal generator is a sequence of registers forming a circular shift register.

8. The method of claim 7, wherein the set of clock signal comprises the outputs of each of the registers in the circular shift register.

9. The method of claim 6, wherein the signal generator is an N-register circular shift register.

10. The method of claim 9, wherein N is eight.

11. The method of claim 9, wherein all N registers are initially set to zero and a one value is loaded into one register out of the N registers.

12. The method of claim 1, wherein the distributing step comprises placing the set of clock signals onto a set of connections connected to each signal path in the plurality of signal paths.

13. The method of claim 12, wherein each signal path receives the set of clock signals.

14. The method of claim 12, wherein each signal path receives the same set of clock signals.

15. The method of claim 1, wherein the distributing step comprises:
   inserting a delay between transitions in the signals in the set of clock signals; and
   placing the set of clock signals onto a set of connections connected to each signal path in the plurality of signal paths.

16. A circuit for generating a set of clock signals for use in activating and deactivating rotating capacitors in a radio receiver with a plurality of signal paths, the circuit comprising:
   a reference signal generator to generate a clock signal at a specified frequency;
   a clock divider coupled to the reference signal generator, the divider containing circuitry to divide the clock signal to change the frequency of the clock signal; and
   a clock generator coupled to the clock divider, the clock generator containing circuitry to output the set of clock signals to the plurality of signal paths, each signal path having more than one rotating capacitor.

17. The circuit of claim 16, wherein the clock generator comprises a sequence of registers, and an output of one register is coupled to an input of another register, forming a circular ring of registers.

18. The circuit of claim 17, wherein there are N registers in the clock generator.

19. The circuit of claim 18, wherein N is eight.

20. The circuit of claim 16, wherein the reference signal generator is a local oscillator.

21. The circuit of claim 20, wherein each signal path is coupled to the local oscillator.

22. The circuit of claim 16, wherein the clock divider divides the clock signal by an integer value, N.

23. The circuit of claim 16, wherein the plurality of signal paths form an orthogonal bases.

24. The circuit of claim 23, wherein there are four signal paths: in-phase plus (I+) and minus (I−) and quadrature-phase plus (Q+) and minus (Q−).

25. The circuit of claim 16, wherein the plurality of signal paths form a non-orthogonal bases.

26. The circuit of claim 16, wherein each signal path is clocked by a signal clock provided by the reference signal generator.

27. The circuit of claim 26, wherein each signal path's clock differs from other signal path's clocks.

28. The circuit of claim 16, wherein the clock generator has a plurality of outputs, and the circuit further comprises a non-overlap circuit with inputs coupled to the clock generator and outputs provided to the plurality of signal paths, the non-overlap circuit containing circuitry to insert a delay between signal transitions in the outputs of the clock generator.

29. The circuit of claim 28, wherein the non-overlap circuit comprises a sequence of N logic units, wherein an output of one logic unit is coupled to a first input of another logic unit, forming a circular ring of logic units, each logic unit has a second input coupled to an output of the clock generator, and each logic unit is a combinatorial circuit.

30. The circuit of claim 29, wherein each logic unit comprises:
   a two-input AND gate; and
   an inversion gate coupled to a first input of the two-input AND gate.

* * * * *